United States Patent
Sun et al.

(10) Patent No.: US 12,424,128 B2
(45) Date of Patent: Sep. 23, 2025

(54) DISPLAY PANEL AND DISPLAY DEVICE

(71) Applicant: BEIJING SHIYAN TECHNOLOGY CO., LTD., Beijing (CN)

(72) Inventors: Jiankang Sun, Beijing (CN); Fugiang Li, Beijing (CN); Minglei Chu, Beijing (CN); Tieshi Wang, Beijing (CN); Zhongyuan Wu, Beijing (CN); Wei Sun, Beijing (CN); Kuanjun Peng, Beijing (CN); Rui Liu, Beijing (CN); Xue Dong, Beijing (CN); Dini Xie, Beijing (CN); Jiushi Wang, Beijing (CN); Libo Wang, Beijing (CN); Shunyu Yao, Beijing (CN); Jing Yu, Beijing (CN); Hongrun Wang, Beijing (CN); Lizhen Zhang, Beijing (CN); Changfeng Li, Beijing (CN)

(73) Assignee: BEIJING SHIYAN TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 18/724,792

(22) PCT Filed: Apr. 29, 2022

(86) PCT No.: PCT/CN2022/090410
§ 371 (c)(1),
(2) Date: Jun. 27, 2024

(87) PCT Pub. No.: WO2023/206403
PCT Pub. Date: Nov. 2, 2023

(65) Prior Publication Data
US 2025/0069529 A1    Feb. 27, 2025

(51) Int. Cl.
*G09G 3/00* (2006.01)
*G02F 1/1362* (2006.01)
(Continued)

(52) U.S. Cl.
CPC ............. *G09G 3/001* (2013.01); *G06F 3/013* (2013.01); *H10D 86/441* (2025.01);
(Continued)

(58) Field of Classification Search
CPC ........... G09G 3/001; G09G 2300/0426; G09G 2310/08; G09G 2340/0407;
(Continued)

(56) References Cited

U.S. PATENT DOCUMENTS

2005/0156812 A1* 7/2005 Kinugasa ............... G09G 5/008
345/1.1
2010/0277455 A1* 11/2010 Miwa ................... G09G 3/3233
345/211
(Continued)

FOREIGN PATENT DOCUMENTS

CN     103631023 A    3/2014
CN     105209960 B    5/2014
(Continued)

OTHER PUBLICATIONS

International Search Report and Written cited in PCT/CN2022/090410 dated Oct. 21, 2022 with English Translation, 19 pages.
(Continued)

*Primary Examiner* — Pegeman Karimi
(74) *Attorney, Agent, or Firm* — LEASON ELLIS LLP

(57) ABSTRACT

A display panel and a display device are provided. The display panel includes sub-pixels, data lines and gate lines. The sub-pixels include pixel circuits connected to the data lines and the gate lines. The display panel includes display subregions and selection signal line groups in one-to-one correspondence, each display subregion includes at least two sub-pixels, each selection signal line group includes selection signal lines, and the selection signal lines corresponding to different display subregions are insulated from each other;
(Continued)

the pixel circuit includes a transistor in which an active semiconductor layer includes a first part and a second part, the first part overlaps with the gate line electrically connected with the transistor, and the second part overlaps with at least one selection signal line, and the gate line and the selection signal line are both configured to turn on the transistor upon being input with a turn-on voltage.

20 Claims, 26 Drawing Sheets

(51) Int. Cl.
    *G06F 3/01*     (2006.01)
    *H10D 86/40*     (2025.01)
    *H10D 86/60*     (2025.01)

(52) U.S. Cl.
    CPC ..... *H10D 86/60* (2025.01); *G09G 2300/0426* (2013.01); *G09G 2310/08* (2013.01); *G09G 2340/0407* (2013.01); *G09G 2354/00* (2013.01)

(58) Field of Classification Search
    CPC ...... G09G 2354/00; G09G 3/36; G06F 3/013; H10D 86/441; H10D 86/60; H10D 86/00; G02F 1/1362

See application file for complete search history.

(56) References Cited

U.S. PATENT DOCUMENTS

| | | | |
|---|---|---|---|
| 2016/0064421 A1* | 3/2016 | Oh | H10D 30/6745 257/43 |
| 2016/0133173 A1 | 5/2016 | Tsai et al. | |
| 2017/0221437 A1* | 8/2017 | Xu | G09G 3/3614 |
| 2018/0136528 A1* | 5/2018 | Xiao | G02F 1/136286 |
| 2023/0377494 A1* | 11/2023 | Moradi | G09G 3/006 |

FOREIGN PATENT DOCUMENTS

| | | |
|---|---|---|
| CN | 1105390504 A | 3/2016 |
| CN | 109074774 A | 12/2016 |
| CN | 106531110 A | 3/2017 |
| CN | 106873273 A | 6/2017 |
| CN | 107093609 A | 8/2017 |
| CN | 110809889 A | 6/2018 |

OTHER PUBLICATIONS

Office Action cited in corresponding U.S. Appl. No. 18/768,204, dated Apr. 2, 2025.

* cited by examiner

DISPLAY PANEL AND DISPLAY DEVICE

CROSS-REFERENCE TO RELATED PATENT APPLICATIONS

This application is a U.S. National Stage Application under 35 U.S.C. § 371 of International Patent Application No. PCT/CN2022/090410 filed Apr. 29, 2022, which is incorporated by reference in its entirety. The International Application was published on Nov. 2, 2023, as International Publication No. WO 2023/206403 A1.

TECHNICAL FIELD

At least one embodiment of the present disclosure relates to a display panel and a display device.

BACKGROUND

With the development of information society, three-dimensional (3D) display is increasingly favored by users. At present, 3D display will achieve the effect that the contents seen by the left and right eyes are different based on sacrificing resolution, so high-resolution display becomes a necessary condition for 3D display. The higher the resolution, the better the user experience. However, the higher the resolution, the higher the required system bandwidth and the greater the data processing capacity, which will lead to the improvement of display technology requirements and the increase of cost.

SUMMARY

Embodiments of the disclosure provide a display panel and a display device.

At least one embodiment of the disclosure provides a display panel, comprising: a base substrate; a plurality of sub-pixels, located on the base substrate, at least a part of the sub-pixels comprising a pixel circuit; a plurality of data lines, located on the base substrate and arranged along a first direction, and the pixel circuit of at least one sub-pixel being electrically connected with one of the data lines; a plurality of gate lines, located on the base substrate and arranged along a second direction, the pixel circuit of the at least one sub-pixel being electrically connected with one of the gate lines, and the first direction intersects with the second direction, wherein the display panel comprises a plurality of display subregions and a plurality of selection signal line groups, the plurality of display subregions are arranged in one-to-one correspondence with the plurality of selection signal line groups, each display subregion comprises at least two sub-pixels, each selection signal line group comprises a plurality of selection signal lines, and the selection signal lines corresponding to different display subregions are insulated from each other; the pixel circuit comprises a transistor, an active semiconductor layer in the transistor of the at least one sub-pixel comprises a first part and a second part, the first part overlaps with the gate line electrically connected with the transistor, and the second part overlaps with at least one selection signal line in a direction perpendicular to the base substrate, and the gate line and the selection signal line are both configured to turn on the transistor upon being input with a turn-on voltage.

For example, in some examples, the plurality of display subregions comprise M display subregions arranged along the first direction, and at least one gate line passes through the M display subregions arranged along the first direction, and M is a positive integer greater than or equal to 2.

For example, in some examples, in each of at least some of the selection signal line groups, all of the selection signal lines are electrically connected.

For example, in some examples, the plurality of selection signal lines in at least one selection signal line group comprise a plurality of first selection signal lines, and the first selection signal lines overlap with the second part.

For example, in some examples, the first selection signal lines and the gate lines are located on a same layer.

For example, in some examples, the first selection signal lines and the gate lines are located in different layers.

For example, in some examples, an extension direction of the first selection signal lines is the same as an extension direction of the gate lines, and two adjacent display subregions arranged along the first direction comprise a first display subregion and a second display subregion, and one of the plurality of first selection signal lines arranged in the first display subregion and one of the plurality of first selection signal lines arranged in the second display subregion are located in a same straight line and arranged at intervals.

For example, in some examples, the plurality of selection signal lines in the at least one selection signal line group further comprise at least one second selection signal line, and the second selection signal line is located in a different layer from the first selection signal lines and is electrically connected with the first selection signal lines.

For example, in some examples, an extension direction of the first selection signal lines is the same as an extension direction of the gate lines, an extension direction of the second selection signal line intersects with the extension direction of the first selection signal lines, and at least one second selection signal line passes through the plurality of display subregions.

For example, in some examples, each of at least some of the data lines is electrically connected with two sub-pixels arranged in the first direction; the plurality of gate lines comprise first gate lines and second gate lines alternately arranged along the second direction, a gate line pair including a first gate line and a second gate line is disposed between two adjacent sub-pixels arranged along the second direction, and one of the two sub-pixels arranged along the first direction and electrically connected with the same data line is electrically connected with the first gate line and the other is electrically connected with the second gate line; the second selection signal line and the data lines are located on the same layer.

For example, in some examples, the extension direction of the second selection signal line is the same as that of the data lines, the second selection signal line is located between two adjacent sub-pixels arranged along the first direction, and the two adjacent sub-pixels are electrically connected with different data lines, respectively.

For example, in some examples, one first selection signal line is arranged between the gate lines in each gate line pair, and second parts of the transistors of the pixel circuits electrically connected with the first gate line and the second gate line in the same gate line pair overlaps with a same first selection signal line located between the gate lines in the same gate line pair.

For example, in some examples, the plurality of first selection signal lines comprise a plurality of first selection signal line pairs, and a first selection signal line pair is arranged between two adjacent sub-pixels arranged in the second direction; one gate line pair is arranged between the first selection signal lines in each first selection signal line pair, or one first selection signal line pair is arranged between the gate lines in each gate line pair.

For example, in some examples, the second selection signal line and the data lines are located in different layers.

For example, in some examples, the display panel further comprises: a shading layer, located between the data lines and the base substrate, wherein the second selection signal line and the shading layer are arranged in a same layer.

For example, in some examples, an extension direction of the second selection signal line is the same as that of at least a part of the data lines, and the second selection signal line overlaps the data lines in a direction perpendicular to the base substrate.

For example, in some examples, the first selection signal lines comprise at least one first sub-selection signal line and a plurality of second sub-selection signal lines electrically connected with each other, and the second sub-selection signal lines overlap with the second part; an extension direction of the second sub-selection signal lines intersects with the extension direction of the gate line, an extension direction of the first sub-selection signal line intersects with the extension direction of the second sub-selection signal lines, and the second sub-selection signal lines corresponding to each display subregion are insulated from the second sub-selection signal lines corresponding to other display subregions.

For example, in some examples, the plurality of selection signal lines in the at least one selection signal line group further comprise at least one second selection signal line, which is located in different layers from the first selection signal line and is electrically connected with the first selection signal line, and the second selection signal line passes through at least one display subregion.

For example, in some examples, each of at least some of the data lines is electrically connected with two sub-pixels arranged in the first direction; the plurality of gate lines comprise first gate lines and second gate lines alternately arranged along the second direction, a gate line pair including a first gate line and a second gate line is arranged between two adjacent sub-pixels arranged along the second direction, and one of the two sub-pixels arranged along the first direction and electrically connected with the same data line is electrically connected with the first gate line and the other is electrically connected with the second gate line; the second selection signal line and the data lines are located on a same layer.

For example, in some examples, the extension direction of the second selection signal line is the same as that of at least a part of the data lines, the second selection signal line is located between two adjacent sub-pixels arranged along the first direction and electrically connected with different data lines respectively.

For example, in some examples, the second selection signal line and the data lines are located in different layers.

For example, in some examples, in a direction perpendicular to the base substrate, the second sub-selection signal lines and the second selection signal line overlap the data line, or the second sub-selection signal lines overlap data line, or the second selection signal line overlap the data line.

For example, in some examples, the first sub-selection signal line and the second sub-selection signal lines are an integral structure.

For example, in some examples, the display panel further comprises: a plurality of gate driver groups, arranged along the second direction, the gate driver groups being electrically connected with the gate lines, and at least part of the gate driver groups being configured to be individually input with a frame start signal, wherein the plurality of display subregions comprise a plurality of display subregion rows arranged along the second direction, each display subregion row comprises display subregions arranged along the first direction, and the plurality of gate driver groups are electrically connected with the plurality of display subregion rows in one-to-one correspondence.

For example, in some examples, the display panel further comprises: a plurality of frame start signal lines, wherein the plurality of frame start signal lines are electrically connected with the plurality of gate driver groups in one-to-one correspondence.

For example, in some examples, the display panel further comprises: at least one frame start signal line, wherein a plurality of control units are arranged between the plurality of gate driver groups and the at least one frame start signal line, and the plurality of control units are electrically connected with the plurality of gate driver groups in one-to-one correspondence; each frame start signal line is electrically connected with at least two control units of the plurality of control units to input frame start signals to the at least two control units of the plurality of control units.

For example, in some examples, the at least one frame start signal line only comprises one frame start signal line, and the one frame start signal line is electrically connected with the plurality of control units to input a frame start signal to each of the plurality of control units individually.

For example, in some examples, at least one gate line comprises two sub-gate lines and at least one connection part connecting the two sub-gate lines, the two sub-gate lines are arranged in parallel at a same layer, and the two sub-gate lines and the connection part are in different layers, and the two sub-gate lines included in each gate line are electrically connected through the connection part; one of the two sub-gate lines overlaps with the first portion.

At least one embodiment of the disclosure provides a display device comprising: an eye tracker; a content generating unit, electrically connected with the eye tracker, a data processing part, electrically connected with the content generating unit; and the display panel according to any embodiments as mentioned above, electrically connected with the data processing part, wherein the eye tracker is configured to determine a gaze point position, on a display surface of the display panel, corresponding to an eyeball by tracking a position of the eyeball, and the gaze point position is located in a first region of the display surface, and the display surface further comprises a second region outside the first region, and the first region comprises at least one display subregion; the content generating unit is configured to generate adjustment data according to the gaze point position; the data processing part is configured to generate display data according to the adjustment data; the display panel is configured to receive the display data to adjust a display resolution of an image displayed in the first region to be greater than that of an image displayed in the second region.

For example, in some examples, the first region comprises one display subregion, and the gaze point position is located in the one display subregion; or, the gaze point position is located in one display subregion, and the first region comprises other display subregions surrounding the one display subregion.

For example, in some examples, the content generating unit is configured to collect images displayed on the display surface at a plurality of different positions to generate a plurality of viewpoint images, the plurality of viewpoint images comprise a plurality of first viewpoint images corresponding to the eyeball and a plurality of second viewpoint images except the plurality of first viewpoint images, and at least one first viewpoint image comprises an image formed in the first region and an image formed in the second region, and each second viewpoint image only comprises an image formed in the second region, wherein the content generating unit generating the adjustment data according to the gaze point position comprises: the content generating unit being configured to adjust data of an image in which the first viewpoint image is formed in the second region and data of the second viewpoint image to generate at least partial data of the adjustment data, and the at least partial data of the adjustment data is configured to reduce a display resolution of the image displayed in the second region.

For example, in some examples, the adjustment data comprises first content data and compressed data, the first content data comprises data corresponding to an image configured to be transmitted to the first region, and the compressed data comprises data generated by compressing second content data corresponding to an image configured to be transmitted to the second region by w times, where w is a positive integer greater than 1: the display data comprises first display data and second display data, the data processing part is configured to process the received first content data into the first display data corresponding to the image of the first region, and the data processing part is further configured to repeatedly process the compressed data w times to form the second display data corresponding to the image of the second region.

For example, in some examples, the second region comprises a first sub-region located on at least one side of the first region in the row direction, and the adjustment data comprises p*w rows of adjustment data; the data processing part comprises a row processing unit, the p*w rows of adjustment data transmitted to the row processing unit by the content generating unit comprises p row compressed data and q*w rows of first content data, the image corresponding to the q*w rows of first content data is located in the first region, and the image corresponding to the q row compressed data in the p row compressed data is located in the first sub-region; the row processing unit is configured to repeatedly process the q row compressed data processing for w times to form q*w rows of second display data, and process the q*w rows of first content data into q*w rows of first display data, where 1≤q≤p, and both p and q are positive integers.

For example, in some examples, the second region further comprises a second sub-region located on at least one side of the first region in the column direction; an image corresponding to (p-q) rows of compressed data other than the q rows of compressed data among the p rows of compressed data are located in the second sub-region, and the row processing unit is configured to repeatedly process the (p-q) rows of compressed data for w times to form (p-q)*w rows of second display data.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the present disclosure and thus are not limitative of the present disclosure.

DETAILED DESCRIPTION

Figure 1A:
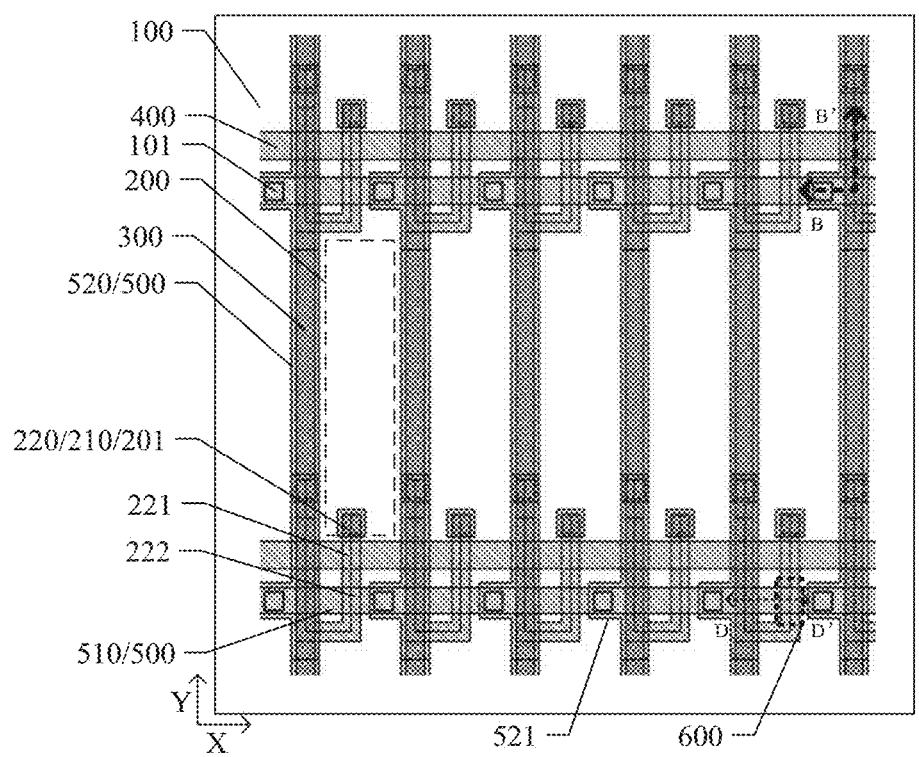
FIG. 1A is a schematic diagram of a partial plane structure of a display panel provided according to an example of an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first." "second." etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

The features "perpendicular to," etc., all include the features "perpendicular to," etc., in the strict sense, as well as the cases containing certain errors, such as "approximately perpendicular to," etc. Considering the measurement and the errors related to the measurement of a specific quantity (e.g., the limitation of the measurement system), they are within an acceptable deviation range for the specific quantity determined by those skilled in the art. For example, the term "approximately" can mean within one or more standard deviations, or within 10% or 5% deviation of the stated value. When the quantity of a component is not specified in the following description of the embodiments of the present disclosure, it means that the number of the component can be one or more, or can be understood as at least one. The phrase "at least one" means one or more, and the phrase "plurality of" means at least two.

In the embodiment of the present disclosure, "the same layer" may refer to a layer structure that uses the same film forming process to form a film layer for making a specific pattern, and then uses the same mask plate to form a layer structure through a patterning process. That is, one patterning process corresponds to one mask plate. According to different specific patterns, one patterning process may include multiple exposure, development or etching processes, and the specific patterns in the formed layer structure may be continuous or discontinuous, which may be at the same height or have the same thickness, may be at different heights or have different thicknesses.

In the research, the inventors of the present application found that the partition control of the display region of the display panel can be realized by increasing the number of thin film transistors, for example, the display panel includes a plurality of sub-pixels, each sub-pixel includes at least one thin film transistor, and the newly added thin film transistor and the thin film transistor included in the sub-pixel jointly control the input of signals. However, the way of increasing the number of thin film transistors as mentioned above will easily lead to a decrease in the aperture ratio of sub-pixels, and if the newly added thin film transistor is disposed in the non-display region of the display panel, it will also easily lead to stripes in displaying by the display panel.

The embodiment of the disclosure provides a display panel and a display device. The display panel includes a base substrate, and a plurality of sub-pixels, a plurality of data lines and a plurality of gate lines located on the base substrate. At least a part of the sub-pixels include a pixel circuit; the plurality of data lines are arranged along a first direction, and the pixel circuit of at least one sub-pixel is electrically connected with one data line; the plurality of gate lines are arranged along the second direction, the pixel circuit of at least one sub-pixel is electrically connected with one gate line, and the first direction intersects with the second direction. The display panel includes a plurality of display subregions and a plurality of selection signal line groups, the plurality of display subregions are arranged in one-to-one correspondence with the plurality of selection signal line groups, each display subregion includes at least two sub-pixels, each selection signal line group includes a plurality of selection signal lines, and the selection signal lines corresponding to different display subregions are insulated from each other; the pixel circuit includes a transistor. An active semiconductor layer in the transistor of at least one sub-pixel includes a first part and a second part. The first part overlaps with a gate line electrically connected to the transistor, and the second part overlaps with at least one selection signal line in a direction perpendicular to the base substrate. The gate line and the selection signal line are both configured to turn on the transistor upon being input with a turn-on voltage. In the display panel provided by the embodiment of the present disclosure, by setting the selection signal line overlapping with the active semiconductor layer of the transistor, it is possible to realize partition display while minimizing the influence on the aperture ratio of the sub-pixel.

The display panel and the display device provided by an embodiment of the present disclosure are described below with reference to the drawings.

Figure 1B:
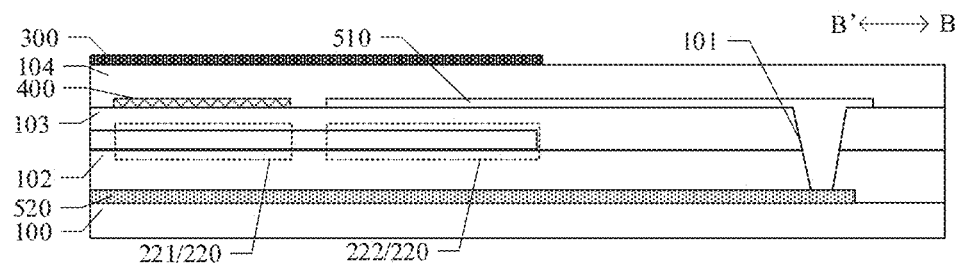
FIG. 1B is a schematic diagram of a partial cross-sectional structure taken along the BB' line shown in FIG. 1A.
Figure 2:
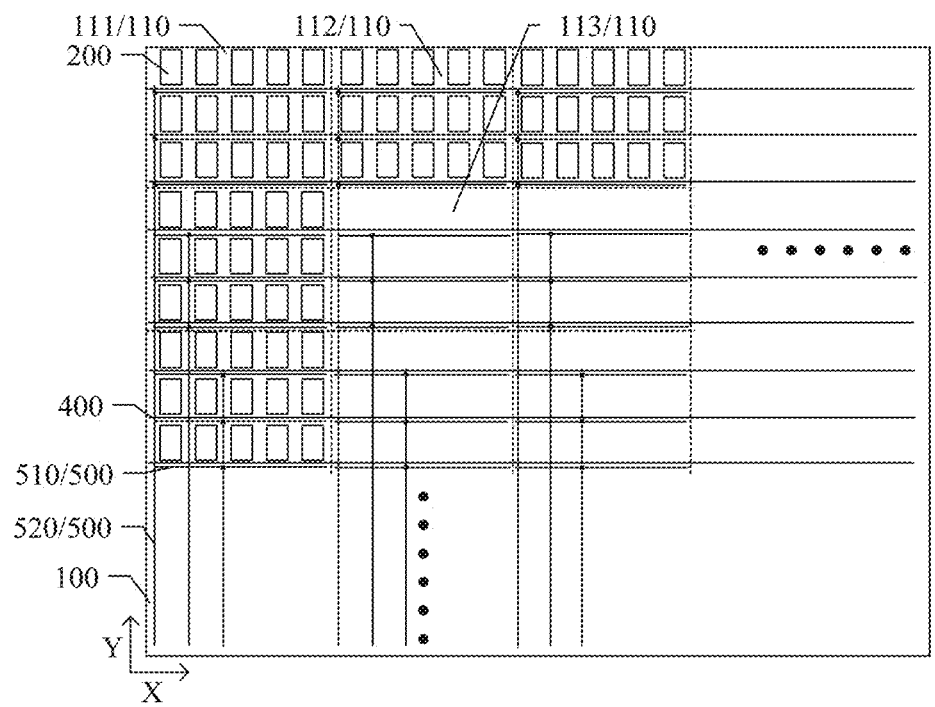
FIG. 2 is a schematic diagram of a plane partition including the display panel shown in FIG. 1A.
Figure 3:
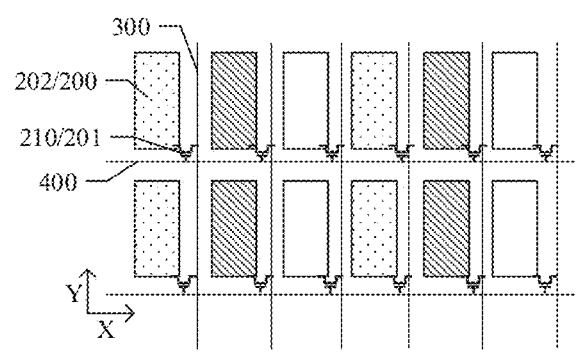
FIG. 3 is a schematic diagram of an electrical connection relationship between sub-pixels and signal lines in the case where no selection signal line group is disposed in the display panel shown in FIG. 1A.

FIG. 1A is a schematic diagram of a partial plane structure of a display panel provided according to an example of an embodiment of the present disclosure, FIG. 1B is a schematic diagram of a partial cross-sectional structure taken along the BB' line shown in FIG. 1A, FIG. 2 is a schematic diagram of a plane partition including the display panel shown in FIG. 1A, and FIG. 3 is a schematic diagram of an electrical connection relationship between sub-pixels and signal lines in the case where no selection signal line group is disposed in the display panel shown in FIG. 1A.

FIG. 2 schematically shows only part of the display subregion, and only part of the display subregions shows sub-pixels. FIG. 2 only schematically shows the number of sub-pixels included in the display subregion, and the number of sub-pixels in the display subregion is not limited to that shown in the figure, and can be set according to the requirements of actual products.

As shown in FIG. 1A to FIG. 2, the display panel includes a base substrate 100, and a plurality of sub-pixels 200, a plurality of data lines 300 and a plurality of gate lines 400 located on the base substrate 100. At least some of the sub-pixel 200 include a pixel circuit 210; the plurality of data lines 300 are arranged in a first direction, and the plurality of gate lines 400 are arranged in a second direction, and the first direction intersects with the second direction. For example, the first direction may be the X direction shown in FIG. 1A, and the second direction may be the Y direction shown in FIG. 1A, but it is not limited thereto, and the first direction and the second direction may be interchanged. For example, the first direction and the second direction may be perpendicular, but not limited thereto. For example, the included angle between the first direction and the second direction may be 30-120 degrees, such as 45-100 degrees, such as 60-90 degrees, etc.

As shown in FIG. 1A to FIG. 2, the pixel circuit 201 of at least one sub-pixel 200 is electrically connected to one data line 300; the pixel circuit 201 of at least one sub-pixel 200 is electrically connected to one gate line 400. For example, the pixel circuit 201 of one sub-pixel 200 is electrically connected to one gate line 400 and one data line 300. For example, the region defined by the intersection of two adjacent gate lines 400 and two adjacent data lines 300 may be the region where the sub-pixel 200 is located.

As shown in FIG. 1A to FIG. 2, the display panel includes a plurality of display subregions 110 and a plurality of selection signal line groups 500, the plurality of display subregions 110 are arranged in one-to-one correspondence with the plurality of selection signal line groups 500, each display subregion 110 includes at least two sub-pixels 200, and each selection signal line group 500 includes a plurality of selection signal lines (such as a first selection signal line 510 and a second selection signal line 520 described later), and the selection signal lines corresponding to different display subregions 110 are insulated from each other. For example, the sub-pixels 200 in one display subregion 110 are electrically connected to the selection signal lines in one selection signal line group 500, and the sub-pixels 200 in different display subregions 110 are electrically connected to the selection signal lines in different selection signal line groups 500. For example, the one-to-one correspondence between the plurality of display subregions 110 and the plurality of selection signal line groups 500 can mean that the sub-pixels 200 in each display subregion 110 are electrically connected with one selection signal line group 500, and the sub-pixels 200 in different display subregions 110 are electrically connected with different selection signal line groups 500.

As shown in FIG. 1A to FIG. 2, the pixel circuit 201 includes a transistor 210, and an active semiconductor layer 220 in the transistor 210 of at least one sub-pixel 200 includes a first part 221 and a second part 222. The first part 221 overlaps with the gate line 400 electrically connected to the transistor 210, and the second part 222 overlaps with at least one selection signal line in a direction perpendicular to the base substrate 100 (such as the direction perpendicular to the main surface of the base substrate 100, that is, the direction perpendicular to the XY plane shown in FIG. 1A). The gate line 400 and the selection signal line are both configured to turn on the transistor upon being input with a turn-on voltage. In the display panel provided by the embodiment of the present disclosure, by setting the selection signal line overlapping with the active semiconductor layer of the transistor, it is possible to realize partition display while minimizing the influence on the aperture ratio of the sub-pixel.

For example, the pixel circuit 201 includes at least two transistors, the gate electrode of at least one transistor is electrically connected with the gate line, and the gate electrode of at least one transistor is electrically connected with the first selection signal line.

For example, as shown in FIG. 1A to FIG. 2, the switching effect of the gate line 400 and the selection signal line group 500 on the transistor 210 can be analogized as an AND gate. Upon both the gate line 400 and the selection signal line group 500 being connected to the turn-on voltage, the transistor 210 is turned on. Upon at least one of the gate line 400 and the selection signal line group 500 being connected with a turn-off voltage, the transistor 210 is in the off state. For example, the gate line 400 is configured to write a row selection signal, and the selection signal line group 500 is configured to write a region selection signal. For example, in the case where the region selection signal is valid, the row selection signal written to the gate line 400 works normally (i.e., functions as normal display). For example, in the case where the transistor is a PMOS transistor (metal oxide semiconductor field effect transistor), the effective signal of the region selection signal is a low voltage; in the case where the transistor is an NMOS transistor, the effective signal of the region selection signal is a high voltage.

For example, as shown in FIG. 2, taking three display subregions 111, 112 and 113 in the display subregion 110 as an example, in the case where no selection signal line group 500 is disposed, the gate signal is written to the gate lines 400 is a line sequence. If the data signal is written to the display subregion 111, the display subregion 112 will also be influenced, and the gate signal is written to the display subregion 113 after the display subregion 111 and the display subregion 112 has been written with the gate signal. The display panel provided by the embodiment of the present disclosure, the gate line and the selection signal line group jointly act on the pixel circuit of the sub-pixel, so that the data can be independently written to any display subregion according to the display needs. For example, the gate signal and the data signal can be written to only the display subregion 113, while the data of the previous frame is kept unchanged in the display subregion 111 and the display subregion 112, which is beneficial to saving bandwidth.

For example, as shown in FIG. 1A to FIG. 2, the number of transistors 210 included in the pixel circuit 201 can be set according to product requirements.

For example, as shown in FIG. 3, in the case where no selection signal line group 500 is provided in the display panel, the pixel circuit 201 may be provided with at least two transistors. For example, each of the transistors includes a source electrode, a drain electrode and a gate electrode. The source electrode and the drain electrode of the transistor can be symmetrical in structure, so there can be no difference in physical structure between the source electrode and the drain electrode.

For example, as shown in FIG. 1A, the pixel circuit 201 may include four transistors, the active semiconductor layers of two transistors overlap the gate line 400, and the active semiconductor layers of the other two transistors overlap the selection signal line. Of course, the embodiment of the present disclosure is not limited thereto, and the pixel circuit 201 may include two transistors, with the active semiconductor layer of one transistor overlapping the gate line and the active semiconductor layer of the other transistor overlapping the selection signal line.

For example, the transistor 210 may include a thin film transistor or a field effect transistor or other switching devices with the same performance, and the thin film transistor may include an oxide semiconductor thin film transistor, an amorphous silicon thin film transistor or a polysilicon thin film transistor.

For example, the pixel circuit 201 may further include at least one capacitor.

For example, as shown in FIG. 1A to 3, the sub-pixel 200 may include a pixel electrode 202, and the transistor 210 includes a transistor electrically connected to the pixel electrode 202.

For example, as shown in FIG. 1A to FIG. 2, in each display subregion 110, the selection signal line group 500 is insulated from the gate line 400 and the data line 300.

In some examples, as shown in FIG. 2, the plurality of display subregions 110 includes M display subregions 110 arranged in a first direction, and at least one gate line 400 passes through the M display subregions arranged in the first direction. For example, each gate line 400 passes through the M display subregions arranged in the first direction.

For example, as shown in FIG. 2, the first direction may be a row direction, and the gate line 400 extends along the row direction and passes through a plurality of display subregions 110 arranged along the row direction, such as the display subregion 111 and the display subregion 112 etc.

In some examples, as shown in FIG. 2, in each selection signal line group 500 of at least some of the selection signal line groups 500, all selection signal lines are electrically connected. For example, the selection signal lines in each selection signal line group 500 are electrically connected.

In some examples, as shown in FIG. 1A to FIG. 2, the plurality of selection signal lines in at least one selection signal line group 500 include a plurality of first selection signal lines 510, and the first selection signal line 510 overlaps with the second portion 222 of the active semiconductor layer 220 of the transistor 210. For example, the gate electrode of one of the transistors 210 is electrically connected to the first selection signal line 510.

In some examples, as shown in FIG. 1A to FIG. 2, the first selection signal line 510 and the gate line 400 are located in the same layer. For example, the first selection signal line 510 and the gate line 400 are both located on a side of the active semiconductor layer 220 of the transistor 210 away from the base substrate 100.

In some examples, as shown in FIG. 1A to FIG. 2, the extending direction of the first selection signal line 510 is the same as that of the gate line 400. For example, the first selection signal line 510 extends in the X direction. For example, the first selection signal line 510 and the gate line 400 are both located in the interval between two adjacent rows of sub-pixels 200. For example, the number of gate lines 400 and the number of second selection signal lines 510 corresponding to each display subregion 110 may be the same. For example, in the Y direction, the gate lines 400 and the first selection signal lines 510 are alternately arranged.

For example, the lengths of the plurality of first selection signal lines 510 corresponding to each display subregion 110 are all the same, but it is not limited thereto, and the lengths of at least some of the first selection signal lines corresponding to each display subregion are different. For example, the lengths of the first selection signal lines 510 corresponding to different display subregions 110 may be the same or different, and may be set according to product requirements.

In some examples, as shown in FIG. 1A to FIG. 2, two adjacent display subregions 110 arranged in the first direction include a first display subregion 111 and a second display subregion 112, and one of the first selection signal lines 510 arranged in the first display subregion 111 and one of the first selection signal lines 510 arranged in the second display subregion 112 are located in the same straight line and arranged at intervals. For example, one first selection signal line 510 corresponding to the first display subregion 111 and one first selection signal line 510 corresponding to the second display subregion 112, which are located in the same straight line, may be two insulated parts formed by disconnecting one selection signal line.

For example, both the first display subregion 111 and the second display subregion 112 include A rows of sub-pixels 200. In each display subregion 110, the second parts of the active semiconductor layers of the transistors 210 in each row of sub-pixels 200 overlaps with the same first selection signal line 510. The first display subregion 111 and the second display subregion 112 respectively correspond to A first selection signal lines 510, and the A'-th first selection signal line 510 corresponding to the first display subregion 111 and the A'-th first selection signal line 510 corresponding to the second display subregion 112 are located in the same straight line and arranged at intervals. The above-mentioned A is a positive integer greater than or equal to 1, and A' is a positive integer greater than or equal to 1 and less than or equal to A.

In some examples, as shown in FIG. 1A to FIG. 2, the plurality of selection signal lines in at least one selection signal line group 500 further includes at least one second selection signal line 520, which is located on a different layer from the first selection signal lines 510 and is electrically connected with the first selection signal lines 510.

For example, as shown in FIG. 1B, the second selection signal line 520 may be located between the first selection signal line 510 and the base substrate 100. For example, FIG. 2 schematically shows that each display subregion 110 corresponds to one second selection signal line 520, but it is not limited thereto, and each display subregion 110 may correspond to a plurality of second selection signal lines 520. For example, a plurality of first selection signal lines 510 corresponding to each display subregion 110 are electrically connected with the same second selection signal line 520 to realize that all selection signal lines corresponding to each display subregion 110 are electrically connected, thus realizing that each display subregion is controlled by the same signal.

For example, as shown in FIG. 1A to FIG. 2, the lengths of different first selection signal lines 510 corresponding to different display subregions 110 may be the same or different.

In some examples, as shown in FIG. 1A to FIG. 2, the extension direction of the first selection signal line 510 is the same as that of the gate line 400, and the extension direction of the second selection signal line 520 intersects with that of the first selection signal line 510, and at least one second selection signal line 520 passes through a plurality of display subregions 110. For example, the second selection signal line 520 electrically connected to the sub-pixels of the display subregion 111 passes through a plurality of display subregions arranged in the Y direction.

For example, as shown in FIG. 1A to FIG. 2, the extension direction of the second selection signal line 520 is the same as that of the data line 300, and at least one second selection signal line 520 passes through at least some display subregions 110 of one column of display subregions 110 arranged in the second direction.

In some examples, as shown in FIGS. 1A and 1B, the second selection signal line 520 and the data line 300 are located in different layers.

In some examples, as shown in FIGS. 1A and 1B, the extension direction of the second selection signal line 520 is the same as that of at least part of the data line 300, and the second selection signal line 520 overlaps the data line 300 in a direction perpendicular to the base substrate 100. Of course, the embodiment of the present disclosure is not limited to the second selection signal line 520 overlapping with the data line 300, and the second selection signal line 520 may not overlap with the data line 300.

For example, as shown in FIGS. 1A and 1B, the second selection signal line 520 may be located between the data line 300 and the base substrate 100. For example, the orthographic projection of the second selection signal line 520 on the base substrate 100 may overlap the orthographic projection of the data line 300 on the base substrate 100. For example, the orthographic projection of the data line 300 on the base substrate 100 may be located within the orthographic projection of the second selection signal line 520 on the base substrate 100.

For example, as shown in FIG. 1B, the active semiconductor layer 220 is located on a side of the second selection signal line 520 away from the base substrate 100, for example, an insulating layer 102 is disposed between the active semiconductor layer 220 and the second selection signal line 520; the first selection signal line 510 is located on a side of the active semiconductor layer 220 away from the base substrate 100, for example, an insulating layer 103 is disposed between the first selection signal line 510 and the active semiconductor layer 220; the data line 300 is located on a side of the first selection signal line 510 away from the base substrate 100, for example, an insulating layer 104 is disposed between the data line 300 and the first selection signal line 510. For example, as shown in FIG. 1B, the first selection signal line 510 is electrically connected to the second selection signal line 520 through the via hole 101 located in the insulating layer 102 and the insulating layer 103. For example, the insulating layer 102 may be a buffer layer, the insulating layer 103 may be a gate insulating layer, and the insulating layer 104 may be an interlayer insulating layer.

Figure 1C:
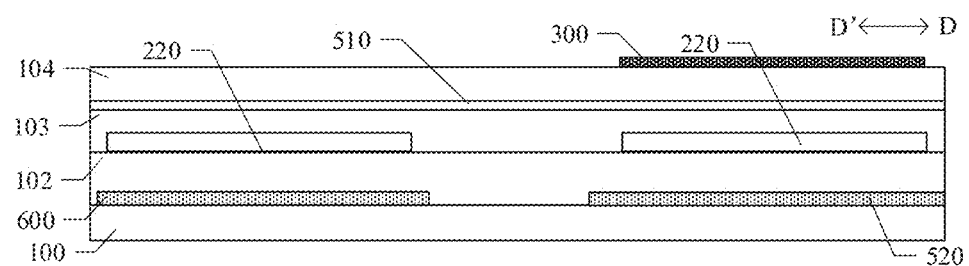
FIG. 1C is a schematic diagram of a partial cross-sectional structure taken along the DD' line shown in FIG. 1A.

FIG. 1C is a schematic diagram of a partial cross-sectional structure taken along the DD' line shown in FIG. 1A. FIG. 1A schematically shows the position of one light shielding layer 600. The display panel provided by the embodiment of the present disclosure includes a plurality of light shielding layers 600, and at least some light shielding layers 600 overlap with the second part 222 of the active semiconductor layer 220.

In some examples, as shown in FIG. 1C, the display panel further includes a light shielding layer 600, which is located between the data line 300 and the base substrate 100, and the second selection signal line 520 is arranged in the same layer as the light shielding layer 600. In the embodiment of the present disclosure, the second selection signal line and the light shielding layer are arranged in the same layer, so that the same materials can be used to form the second selection signal line and the light shielding layer in the same patterning process, and the process steps are saved.

For example, as shown in FIG. 1C, the light shielding layer 600 overlaps with the active semiconductor layer 220 in the direction perpendicular to the base substrate 100. For example, in the direction perpendicular to the base substrate 100, the light shielding layer 600 overlaps with the first selection signal line 510.

For example, as shown in FIG. 1A, the shape of the active semiconductor layer 220 of the transistor 210 may be U-shaped, and the U-shaped active semiconductor layer 220 includes two parts extending in the Y direction and a connection part connecting the two parts. For example, a part of the U-shaped active semiconductor layer 220 extending in the Y direction overlaps the gate line 400 and the first selection signal line 510, and another part extending in the Y direction overlaps both the second selection signal line 520 and the data line 300. For example, one end of a portion of the U-shaped active semiconductor layer 220 extending in the Y direction and overlapping with the gate line 400 is electrically connected to the pixel electrode, and one end of a portion of the U-shaped active semiconductor layer 220 extending in the Y direction and overlapping with the data line 300 is electrically connected to the data line 300.

For example, as shown in FIG. 1A, the second selection signal line 520 includes a protrusion 521, which overlaps with the first selection signal line 510 in the direction perpendicular to the base substrate 100, and the protrusion 521 is electrically connected with the first selection signal line 510 through the via hole 101. For example, a protrusion 521 is disposed between the active semiconductor layers 220 of adjacent transistors 210 arranged in the X direction. For example, in the direction perpendicular to the base substrate 100, the active semiconductor layer 220 does not overlap with the protrusion 521. For example, an orthographic projection of the active semiconductor layer 220 of the transistor 210 on a straight line extending in the Y direction and an orthographic projection of the protrusion 521 on the straight line overlap.

For example, as shown in FIG. 1A, one column of sub-pixels 200 is arranged between adjacent data lines 300, and one row of sub-pixels 200 is arranged between adjacent gate lines 400.

Figure 4:
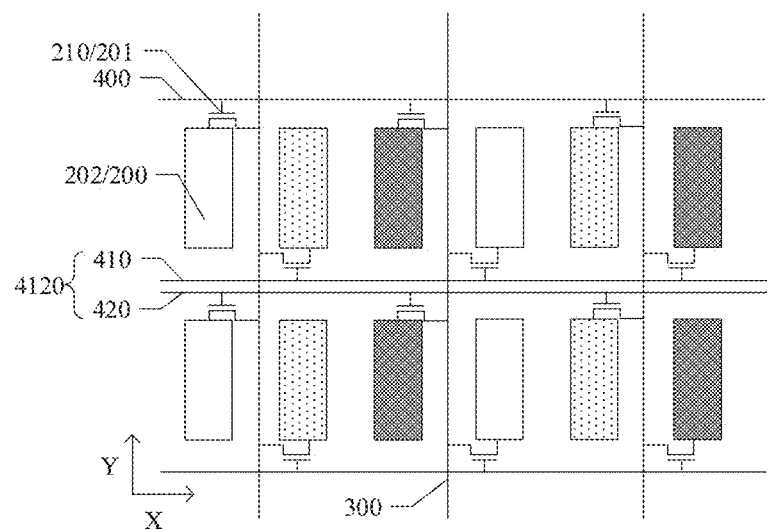
FIG. 4 is a schematic diagram of an electrical connection relationship between sub-pixels and signal lines in the case where no selection signal line group is disposed in the display panel according to another example of the embodiment of the present disclosure.
Figure 5:
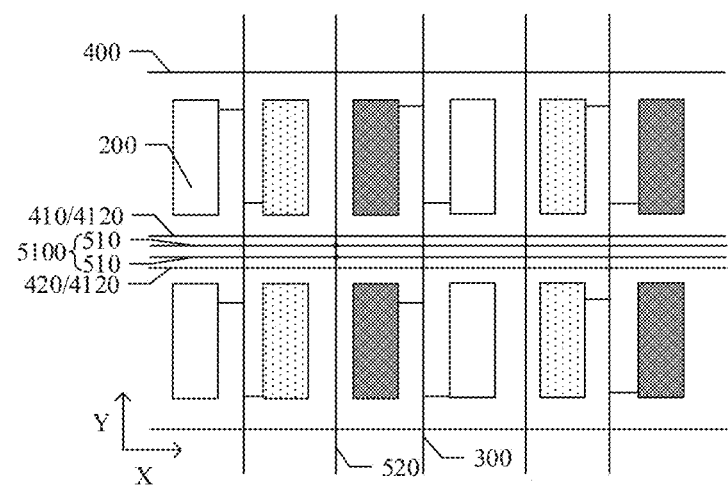
FIG. 5 is a schematic diagram of a distribution relationship between sub-pixels and signal lines in the display panel shown in FIG. 4 after setting a selection signal line group in an example.
Figure 6:
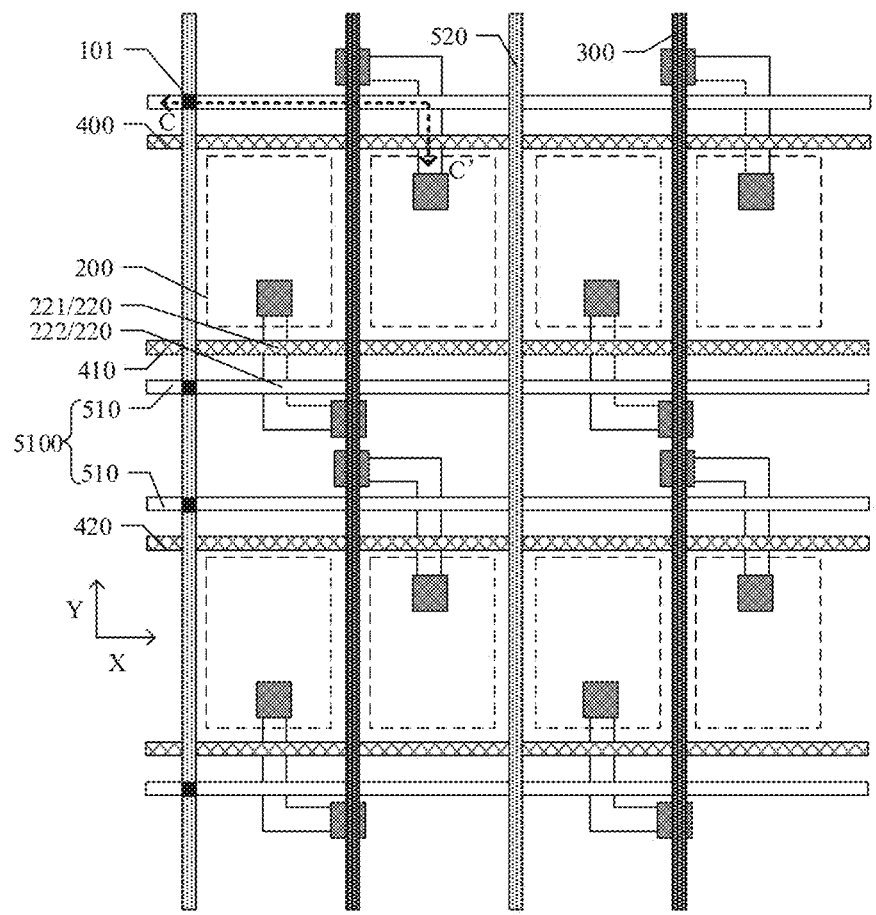
FIG. 6 is a schematic diagram of an overlapping relationship of some sub-pixels with gate lines and selection signal lines in the display panel shown in FIG. 5.
Figure 7:
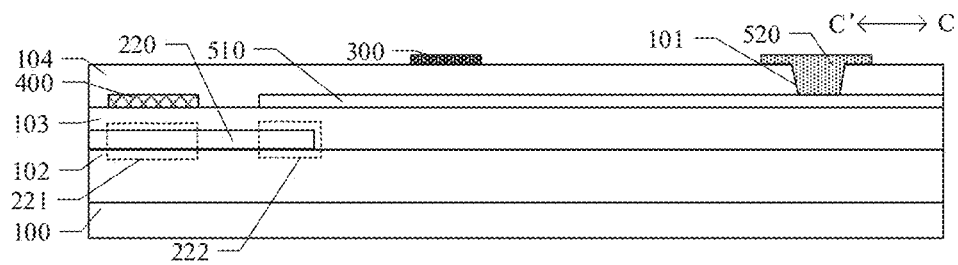
FIG. 7 is a schematic diagram of a partial cross-sectional structure taken along the line CC' shown in FIG. 6.

FIG. 4 is a schematic diagram of an electrical connection relationship between sub-pixels and signal lines in the case where no selection signal line group is not disposed in the display panel according to another example of the embodiment of the present disclosure; FIG. 5 is a schematic diagram of a distribution relationship between sub-pixels and signal lines in the display panel shown in FIG. 4 after setting a selection signal line group in an example; FIG. 6 is a schematic diagram of an overlapping relationship of some sub-pixels with gate lines and selection signal lines in the display panel shown in FIG. 5; and FIG. 7 is a schematic diagram of a partial cross-sectional structure taken along the line CC' shown in FIG. 6.

The display panel in the example shown in FIG. 4 is different from the display panel in the example shown in FIG. 3 in that the electrical connection relationship between sub-pixels and signal lines is different, the positional relationship between the second selection signal lines is different, and the positional relationship between the first selection signal lines and the gate lines is different. FIG. 6 schematically shows that the transistor 210 includes two transistors, but it is not limited thereto, and the number of the transistors can also be four as shown in FIG. 1A, or other number, such as three or more.

In some examples, as shown in FIGS. 4 to 7, each data line 300 in at least some data lines 300 is electrically connected with two sub-pixels 200 arranged in the first direction. For example, the same data line 300 is electrically connected to two columns of sub-pixels 200, and one column of sub-pixels 200 includes a plurality of sub-pixels 200 arranged along the Y direction. For example, the two columns of sub-pixels 200 electrically connected to the same data line 300 may be located at both sides of the data line 300.

In some examples, as shown in FIGS. 4 to 7, the plurality of gate lines 400 include first gate lines 410 and second gate lines 420 alternately arranged in the second direction, and a gate line pair 4120 including a first gate line 410 and a second gate line 420 is disposed between two adjacent sub-pixels 200 arranged in the second direction, and one of the two sub-pixels 200 arranged in the first direction and electrically connected to the same data line 300 is electrically connected to the first gate line 410 and the other of the two sub-pixels 200 is electrically connected with the second gate line 420. The display panel shown in FIG. 4 adopts dual gate technology, which reduces the number of data lines in the display panel by half and doubles the number of gate lines, that is, reduces the number of source drive integrated circuits connected with data lines by half and doubles the number of gate drive integrated circuits connected with gate lines. Because the unit price of the gate drive integrated circuit is cheaper than that of the source drive integrated circuit, the cost is reduced.

The pixel structure of the display panel adopting the dual gate technology provided by the embodiment of the present disclosure is not limited to the pixel structure shown in FIG. 4. For example, the plurality of data lines include first data lines and second data lines alternately arranged along the first direction, and two lines of sub-pixels arranged along the second direction are arranged between the first data line and the second data line, and the first data line and the second data line are respectively configured to transmit voltages with different polarities, and different sub-pixels connected to the same data line are connected to different gate lines. Two adjacent sub-pixels arranged along the first direction are respectively connected to the first data line and the second data line, and a line of sub-pixels arranged along the second direction are all connected to the first data line or a line of sub-pixels arranged along the second direction are all connected to the second data line. For example, the plurality of data lines include first data lines and second data lines alternately arranged along the first direction, and two adjacent sub-pixels arranged along the first direction are respectively connected to the first data line and the second data line, and two adjacent sub-pixels arranged along the second direction are respectively connected to the first data line and the second data line.

For example, the overlapping relationships between the active semiconductor layer 220 of the transistor and the gate line 400, and between the active semiconductor layer 220 of the transistor and the first selection signal line 510 in the example shown in FIG. 6 may be the same as that shown in FIG. 1A, which will not be repeated here again. The display subregion 110 of the display panel in the examples shown in FIGS. 4 to 7 may have the same characteristics as the display subregion shown in FIG. 2, which will not be repeated here again.

For example, as shown in FIGS. 4 to 7, the first selection signal line 510 and the second selection signal line 520 are located in different layers, and the first selection signal line 510 is electrically connected with the second selection signal line 520 through the via hole 101 located in the insulating layer between the first selection signal line 510 and the second selection signal line 520.

In some examples, as shown in FIG. 6, the second selection signal line 520 is located in the same layer as the data line 300. For example, the data lines 300 and the second selection signal lines 520 are alternately arranged in the X direction.

In some examples, as shown in FIGS. 5 and 6, the extension direction of the second selection signal line 520 is the same as that of the data line 300, and the second selection signal line 520 is located between two adjacent sub-pixels 200 arranged in the first direction, and the two adjacent sub-pixels 200 are electrically connected with different data lines 300, respectively.

For example, as shown in FIGS. 5 and 6, two columns of sub-pixels 200 are arranged between two adjacent data lines 300, two columns of sub-pixels 200 are arranged between two adjacent second selection signal lines 520, and one column of sub-pixels 200 is arranged between the data line 300 and the second selection signal line 520 that are adjacent to each other.

In the display panel provided by the embodiment of the present disclosure, by arranging the second selection signal line between two adjacent columns of sub-pixels without data lines therebetween, the control of partition display can be realized without affecting the aperture ratio of the sub-pixels. In addition, the second selection signal lines, which are arranged in the same layer as the data lines, can be made of the same material and formed in the same patterning process as the data lines, and the manufacturing process of the display panel cannot be increased.

In some examples, as shown in FIGS. 5 and 6, the plurality of first selection signal lines 510 include a plurality of first selection signal line pairs 5100, and the first selection signal line pairs 5100 are disposed between two adjacent sub-pixels 200 arranged in the second direction.

In some examples, as shown in FIGS. 5 and 6, one first selection signal line pair 5100 is disposed between the gate lines in each gate line pair 4120. Of course, the embodiment of the present disclosure is not limited thereto, and one gate line pair may be disposed between the first selection signal lines in one first selection signal line pair.

For example, as shown in FIG. 7, the active semiconductor layer 220 is located between the first selection signal line 510 and the base substrate 100, the data line 300 is located on a side of the first selection signal line 510 away from the base substrate 100, and the second selection signal line 520 is located on a side of the first selection signal line 510 away from the base substrate 100, and is electrically connected with the first selection signal line 510 through the via hole 101 located in the insulating layer 104. Both the gate line 400 and the first selection signal line 510 are located on the insulating layer 103. Both the data line 300 and the second selection signal line 520 are located on the insulating layer 104.

For example, as shown in FIGS. 5 and 6, in the case where the turn-on voltage is input to the first selection signal line 510, the sub-pixel 200 in the display subregion is controlled by the row scanning signal in the gate line 400; in the case where the turn-off voltage is input to the first selection signal line 510, the sub-pixel 200 is not controlled by the row scanning signal in the gate line 400.

Figure 8:
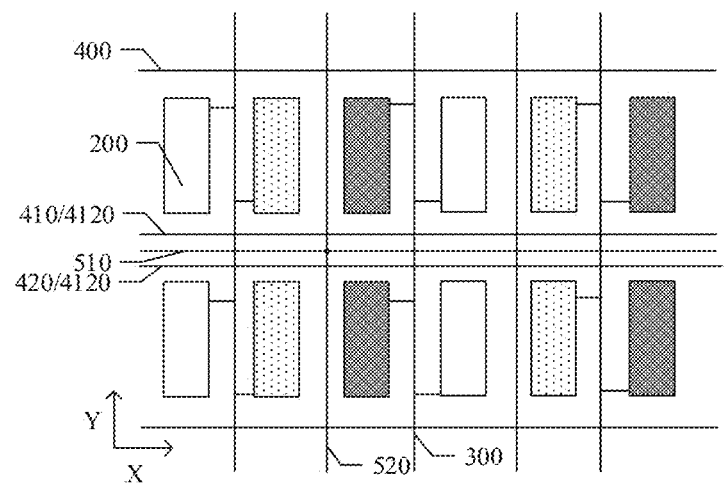
FIG. 8 is a schematic diagram of a distribution relationship between sub-pixels and signal lines in the display panel shown in FIG. 4 after setting a selection signal line group in another example.
Figure 9:
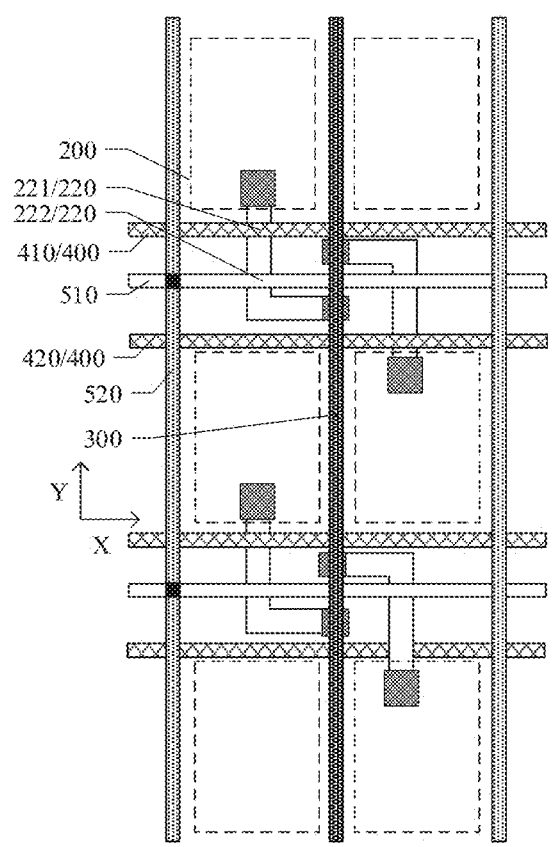
FIG. 9 is a schematic diagram of an overlapping relationship of some sub-pixels with gate lines and selection signal lines in an example of the display panel shown in FIG. 8.
Figure 10:
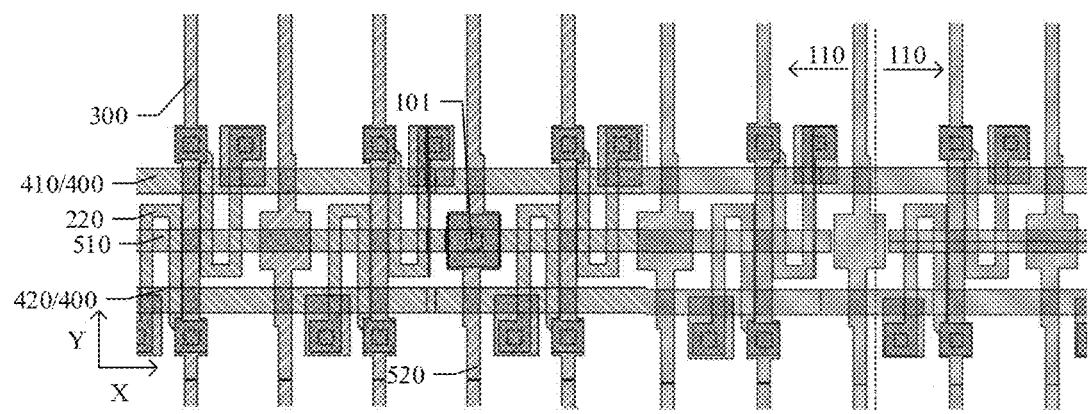
FIG. 10 is a schematic diagram of an overlapping relationship of some sub-pixels with gate lines and selection signal lines in another example of the display panel shown in FIG. 8.

FIG. 8 is a schematic diagram of a distribution relationship between sub-pixels and signal lines in the display panel shown in FIG. 4 after setting a selection signal line group in another example; FIG. 9 is a schematic diagram of an overlapping relationship of some sub-pixels with gate lines and selection signal lines in an example of the display panel shown in FIG. 8; and FIG. 10 is a schematic diagram of an overlapping relationship of some sub-pixels with gate lines and selection signal lines in another example of the display panel shown in FIG. 8. The electrical connection manner of the first selection signal line 510 and the second selection signal line 520, and the positional relationship between the second selection signal line 520 and the data line 300 in the example shown in FIG. 8 can be the same as the corresponding features in the examples shown in FIGS. 6 and 7, and will not be repeated here.

In some examples, as shown in FIGS. 8 and 9, one first selection signal line 510 is arranged between each gate line pair 4120, and the second part 222 of the active semiconductor layer 220 of the transistor of the pixel circuit electrically connected with the first gate line 410 and the second gate line 420 in the same gate line pair 4120 overlaps with the same first selection signal line 510 located between the first gate line 410 and the second gate line 420 in the same gate line pair 4120.

For example, as shown in FIGS. 8 and 9, the active semiconductor layers 220 of transistors in two sub-pixels 200 which are electrically connected to the same data line 300 and being in two adjacent rows of sub-pixels are disposed to overlap with the same first selection signal line 510, so that it is possible to use a smaller number of first selection signal lines to realize partition display, which is beneficial to improving the aperture ratio of sub-pixels.

For example, the display panel shown in FIG. 10 is different from the display panel shown in FIG. 9 in that the pattern of the active semiconductor layer 220 of the transistor shown in FIG. 9 is different. The shape of the active semiconductor layer 220 of the transistor shown in FIG. 9 can be I-shaped, for example, at least one sub-pixel includes two transistors, for example, the active semiconductor layer 220 only includes one first portion 221 overlapping the gate line 400 and one second portion 222 overlapping the first selection signal line 510. The active semiconductor layer 220 of the transistor shown in FIG. 10 may be U-shaped, for example, at least one sub-pixel includes four transistors, for example, the active semiconductor layer 220 includes two first portions 221 overlapping with the gate line 400 and two second portions 222 overlapping with the first selection signal line 510.

For example, as shown in FIG. 10, two first selection signal lines 510 located in the same straight line extending in the X direction corresponding to adjacent display subregions 110 arranged in the X direction are disconnected, that is, a gap is provided therebetween. For example, the second selection signal line 520 may be provided at the interval between two first selection signal lines 510 corresponding to adjacent display subregions 110. For example, in the direction perpendicular to the base substrate, at least one of the two first selection signal lines 510 corresponding to adjacent display subregions 110 does not overlap with the second selection signal line 520 arranged at the interval between them, but the embodiment of the present disclosure is not limited thereto, and at least one of the two first selection signal lines may overlap with the second selection signal line arranged at the interval between them.

The above embodiment schematically shows that the shapes of the gate line, the data line and the first selection signal line are all straight lines, but it is not limited thereto, and the shape of at least one of the gate line, the data line and the first selection signal line may be a broken line.

Figure 11:
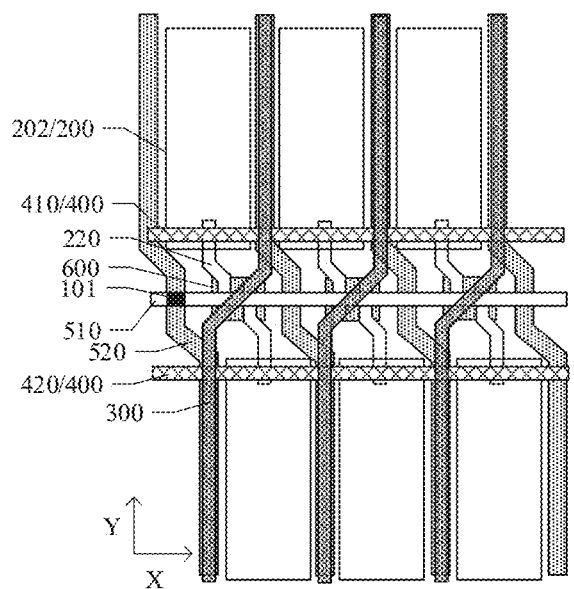
FIGS. 11 and 12 are schematic diagrams of local sub-pixels, signal lines and selection signal line groups of a display panel provided according to different examples of an embodiment of the present disclosure.
Figure 12:
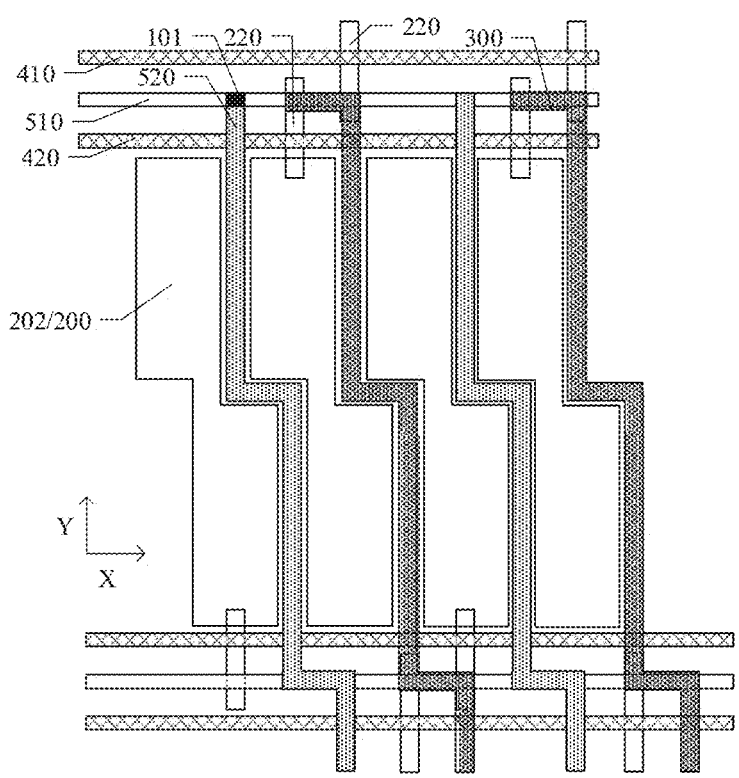

FIGS. 11 and 12 are schematic diagrams of local sub-pixels, signal lines and selection signal line groups of a display panel provided according to different examples of an embodiment of the present disclosures. The distribution of sub-pixels in the examples shown in FIGS. 11 and 12 is different from that in FIGS. 9 and 1A. The positional relationship between the first selection signal line 510 and the gate line pair in the display panel shown in FIGS. 11 and 12 can be the same as that in FIG. 9, and the electrical connection relationship between the first selection signal line 510 and the second selection signal line 520 in the example shown in FIG. 11 can be the same as that in the example shown in FIG. 1A. The electrical connection relationship between the first selection signal line 510 and the second selection signal line 520 and the positional relationship between the second selection signal line 520 and the data line 300 in the example shown in FIG. 12 can be the same as the corresponding features in the example shown in FIG. 9, and the sub-pixels shown in FIGS. 11 and 12 include two transistors, which will not be repeated here.

For example, as shown in FIG. 11, in a direction perpendicular to the base substrate 100, a portion of the second selection signal line 520 overlaps a portion of the data line 300. For example, a portion of the second selection signal line 520 located between adjacent sub-pixels 200 arranged in the X direction overlaps a portion of the data line 300 located between adjacent sub-pixels 200 arranged in the X direction.

For example, as shown in FIG. 11, the second selection signal line 520 is arranged in the same layer as the light shielding layer 600. For example, in the direction perpendicular to the base substrate, the light shielding layer 600 overlaps the data line 300. For example, the light shielding layer 600 overlaps at least one of the first selection signal line 510 and the active semiconductor layer 220 in the direction perpendicular to the base substrate.

For example, as shown in FIG. 11, two adjacent rows of sub-pixels 200 are shifted along the X direction. For example, two adjacent rows of sub-pixels 200 are shifted by half of the pixel pitch in the X direction. The distribution of sub-pixels in the display panel shown in FIG. 11 is beneficial to improving the aperture ratio.

For example, as shown in FIG. 11, a line connecting the centers of the light emitting regions of two sub-pixels 200 connected to the same data line 300 and respectively located in two adjacent sub-pixel rows intersect with the Y direction. For example, the data line 300 includes line segments of broken line, the part of the data line 300 between adjacent sub-pixels 200 arranged in the X direction extends in the Y direction, and the extending direction of the part of the data line 300 between two adjacent sub-pixel rows intersects with the Y direction. For example, the second selection signal line 520 includes line segments of broken line, and the second selection signal line 520 located between two adjacent sub-pixel rows does not overlap with the data line 300.

For example, the shape of the pixel electrode 202 of the sub-pixel 200 in the example shown in FIG. 12 is different from that of the pixel electrode in the above-mentioned example. The pixel electrode 202 of the sub-pixel 200 in this example includes two rectangles and a connecting structure connecting the two rectangles. For example, two adjacent rows of sub-pixels 200 are shifted in the X direction. For example, two adjacent rows of sub-pixels 200 are shifted by half of the pixel pitch in the X direction. The distribution of sub-pixels in the display panel shown in FIG. 12 is beneficial to improving the aperture ratio. For example, both the data line 300 and the second selection signal line 520 include line segments of broken line.

Figure 13:
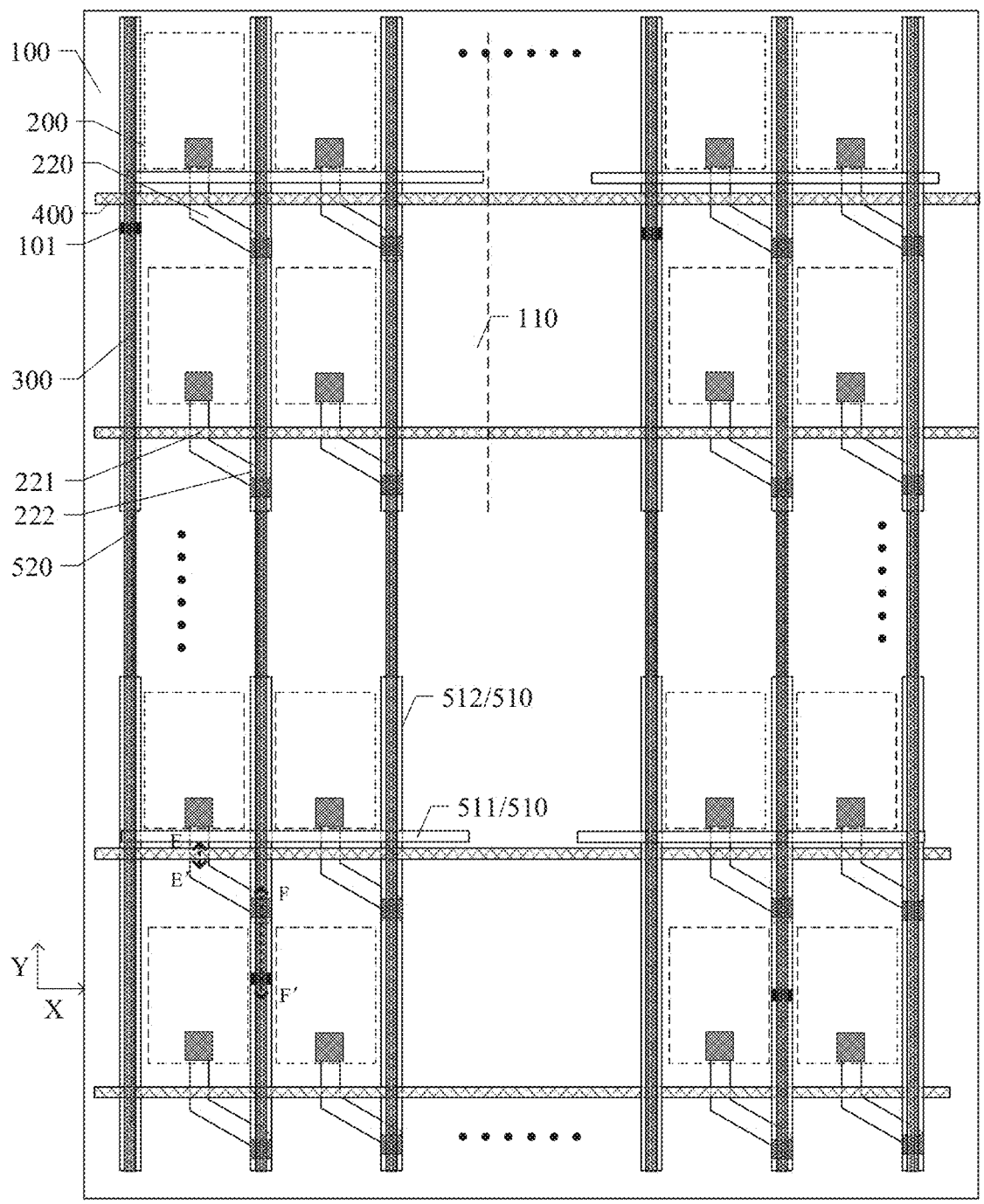
FIG. 13 is a schematic diagram of a partial plane structure of a display panel provided according to another example of an embodiment of the present disclosure.
Figure 14:
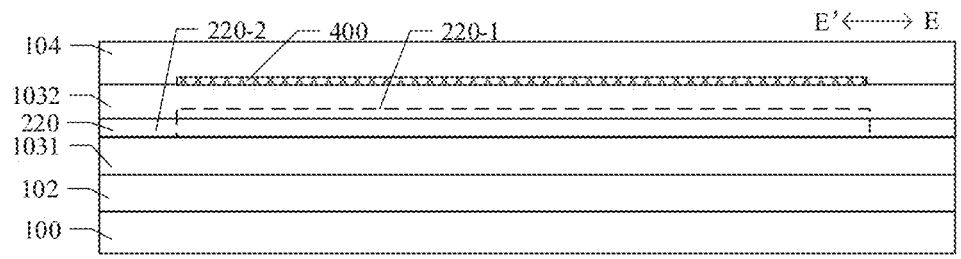
FIG. 14 is a schematic diagram of a partial cross-sectional structure taken along the line EE' shown in FIG. 13.
Figure 15:
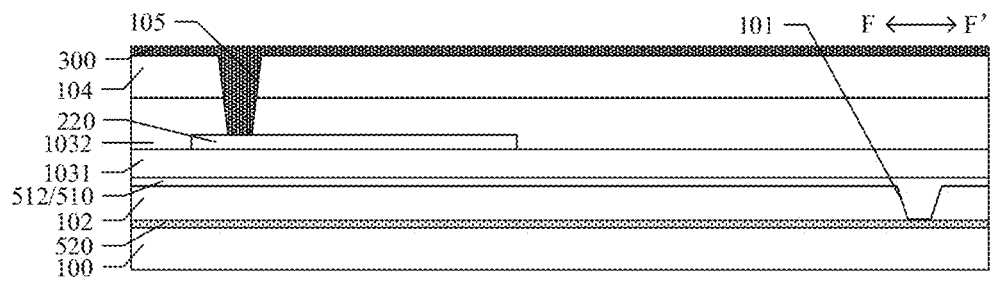
FIG. 15 is a schematic diagram of a partial cross-sectional structure taken along the FF' line shown in FIG. 13.

FIG. 13 is a schematic diagram of a partial plane structure of a display panel provided according to another example of an embodiment of the present disclosure, FIG. 14 is a schematic diagram of a partial cross-sectional structure taken along the line EE' shown in FIG. 13, and FIG. 15 is a schematic diagram of a partial cross-sectional structure taken along the FF' line shown in FIG. 13. The transistor in the display panel in any of the examples shown in FIGS. 1A to 12 can be a top gate transistor or a bottom gate transistor, and the transistor in the display panel shown in FIG. 13 is a transistor including a top gate and a bottom gate. In this example, the overlapping relationship between the transistor and the first selection signal line is different from the above examples.

FIG. 13 takes the arrangement of gate lines and data lines, and the electrical connection relationship of the gate lines and the data line with the sub-pixels as shown in FIG. 1A as an example, but it is not limited thereto. The display panel shown in this example can also adopt the arrangement of gate lines and data lines and the electrical connection relationship of the gate lines and the data lines with the sub-pixels as shown in FIG. 6 or 9. The data lines, the gate lines, and the electrical connection relationships between the gate lines and the transistors, and between the data lines and the transistors in the display panel shown in FIG. 13 may be the same as the corresponding features in the display panel shown in any of the above examples. The display subregion and the corresponding relationship between the display subregion and the selection signal line group in the display panel shown in FIG. 13 can be the same as the corresponding features in the display panel shown in any of the above examples.

In some examples, as shown in FIGS. 13 to 15, the first selection signal line 510 and the gate line 400 are located in different layers. For example, the first selection signal line 510 is located between the gate line 400 and the base substrate 100. For example, the gate line 400 is located on a side of the active semiconductor layer 220 away from the base substrate 100, and the first selective signal line 510 is located between the active semiconductor layer 220 and the base substrate 100.

In some examples, as shown in FIGS. 13 to 15, the first selection signal line 510 includes at least one first sub-selection signal line 511 and a plurality of second sub-selection signal lines 512 electrically connected to each other, and the second sub-selection signal lines 512 overlap with the second portion 222 of the active semiconductor layer 220. The extension direction of the second sub-selection signal line 512 intersects the extension direction of the gate line 400, the extension direction of the first sub-selection signal line 511 intersects the extension direction of the second sub-selection signal line 512, and the second sub-selection signal line 512 corresponding to each display subregion 110 is insulated from the second sub-selection signal lines 512 corresponding to other display subregions 110.

In this example, by adopting a transistor with a top gate electrode and a bottom gate electrode, one of the top gate electrode and the bottom gate electrode of the transistor is overlapped with the gate line, and the other of the top gate electrode and the bottom gate electrode of the transistor is overlapped with the first selection signal line, which is beneficial to saving layout space.

For example, FIGS. 13 to 15 schematically show that the top gate electrode of the transistor is electrically connected with the gate line 400, the bottom gate electrode of the transistor is electrically connected with the first selection signal line 510, and the overlapping portion 220-1 with the gate line 400 is the intrinsic region, and the transistor is controlled to be turned on by the turn-on voltage input to the gate line 400; the active semiconductor layer 220 further includes a heavily doped (e.g., n-doped or p-doped) region 220-2, which is a conductive region. The overlapping part of the active semiconductor layer 220 and the first selection signal line 510 is an intrinsic region, and the transistor is controlled to be turned on by the turn-on voltage input to the first selection signal line 510, thereby cooperating with the normal reading and writing of the line scanning signal transmitted by the gate line 400.

For example, FIG. 14 schematically shows the top gate structure of the transistor, and FIG. 15 schematically shows the bottom gate structure of the transistor. The bottom gate structure shown in FIG. 15 includes two examples. For example, the active semiconductor layer 220 corresponding to the bottom gate electrode is an intrinsic region, and whether the active semiconductor layer 220 in the intrinsic region is conductive or not is controlled by whether the bottom gate voltage is effective; for example, the active semiconductor layer 220 corresponding to the bottom gate electrode (i.e., the second part overlapping with the first selection signal line 510) has a part electrically connected with the data line 300 through the via hole 105 and this part is heavily doped, and the region, of the active semiconductor layer 220 corresponding to the bottom gate electrode, other than the part overlapping with the via hole 105 is the intrinsic region, and whether the active semiconductor layer 220 in the intrinsic region is conductive or not is controlled by whether the bottom gate voltage is effective.

In some examples, as shown in FIGS. 13 to 15, the first sub-selection signal line 511 and the second sub-selection signal line 512 have an integral structure. Of course, the embodiment of the present disclosure is not limited thereto, and the first sub-selection signal line and the second sub-selection signal line may also be two independent structures electrically connected to each other.

For example, as shown in FIG. 13, the number of first sub-selection signal lines 511 is smaller than the number of second sub-selection signal lines 512 in the selection signal line group corresponding to the same display subregion 110. For example, the number of second sub-selection signal lines 512 is the same as the number of sub-pixel columns extending in the Y direction. For example, among the selection signal lines corresponding to each display subregion 110, the first sub-selection signal line 511 is electrically connected to all the second sub-selection signal lines 512. Of course, the embodiment of the present disclosure is not limited thereto, and the number of the first sub-selection signal lines can be set according to actual needs.

For example, as shown in FIG. 13, the first sub-selection signal lines 511 corresponding to two adjacent display subregions 110 arranged in the X direction are insulated from each other, for example, the two first sub-selection signal lines 511 can be located on the same straight line with a space therebetween.

For example, as shown in FIG. 13, the second sub-selection signal lines 512 corresponding to two adjacent display subregions 110 arranged in the Y direction are insulated from each other, for example, the second sub-selection signal lines 512 corresponding to two adjacent display subregions 110 can be located on the same straight line with a space therebetween.

For example, as shown in FIG. 13, each second selection signal line 520 is electrically connected to only the second sub-selection signal line 512 corresponding to one display subregion 110. For example, the second sub-selection signal lines 512 corresponding to one display subregion 110 may be electrically connected with at least one second selection signal line 520.

For example, as shown in FIGS. 13 to 15, the extension direction of the first sub-selection signal line 511 may be the same as that of the gate line 400, and the extension direction of the second sub-selection signal line 512 may be the same as that of the data line 300. For example, in the direction perpendicular to the base substrate 100, the second sub-selection signal line 512 overlaps with the data line 300. For example, the second sub-selection signal line 512 is located between the data line 300 and the base substrate 100.

For example, as shown in FIGS. 13 to 15, an insulating layer 102 and an insulating layer 1031 are provided between the active semiconductor layer 220 and the base substrate 100, and an insulating layer 1032 is provided between the gate line 300 and the active semiconductor layer 220. For example, the insulating layer 1031 and the insulating layer 1032 are both gate insulating layers, such as a first gate insulating layer and a second gate insulating layer, respectively. An insulating layer 102 is disposed between the active semiconductor layer 220 and the second selection signal line 520, an insulating layer 1031 is disposed between the first selection signal line 510 and the active semiconductor layer 220, and the insulating layer 1032 and an insulating layer 104 are disposed between the active semiconductor layer 220 and the data line 300.

In some examples, as shown in FIGS. 13 to 15, the plurality of selection signal lines in at least one selection signal line group 500 further includes at least one second selection signal line 520, which is located on different layers from the first selection signal line 510 and is electrically connected with the first selection signal line 510, and passes through at least one display subregion.

In some examples, the second selection signal line 520 and the data line 300 are located in different layers.

The second selection signal line 520 in this example may have the same characteristics as the second selection signal line 520 in the display panel shown in FIG. 1A, and will not be repeated here again.

In some examples, as shown in FIGS. 13 to 15, at least one of the second sub-selection signal line 512 and the second selection signal line 520 overlaps the data line 300 in a direction perpendicular to the base substrate 100. For example, both the second sub-selection signal line 512 and the second selection signal line 520 overlap the data line 300, and the second sub-selection signal line 512 is located between the second selection signal line 520 and the data line 300. For example, the second sub-selection signal line 512 is electrically connected to the second selection signal line 520 through the via hole 101 in the insulating layer 102.

For example, a display panel having transistors with top and bottom gate electrodes as shown in FIG. 13 may adopt a double gate line design as shown in FIGS. 5 to 12. For example, each data line 300 in at least some data lines 300 is electrically connected with two sub-pixels 200 arranged in the first direction; the plurality of gate lines 400 include first gate lines 410 and second gate lines 420 alternately arranged along the second direction, a gate line pair including the first gate line 410 and the second gate line 420 is disposed between two adjacent sub-pixels 200 arranged along the second direction, and one of the two sub-pixels 200 arranged along the first direction and connected to the same data line 300 is electrically connected with the first gate line 410 and the other of the two sub-pixels 200 is electrically connected with the second gate line 420; the second selection signal line 520 is located in the same layer as the data line 300. Transistors with top and bottom gate electrodes matching with dual gate design is beneficial to saving layout space while improving the aperture ratio of sub-pixels.

For example, in the display panel including transistors with top and bottom gate electrodes as shown in FIG. 13, upon the second selection signal line 520 being arranged in the same layer as the data line 300, the second selection signal line 520 can be electrically connected with the first sub-selection signal line 511 to realize the electrical connection with the first selection signal line 510.

For example, in the display panel with transistors with top and bottom gate electrodes as shown in FIG. 13, upon the second selection signal line 520 being arranged in the same layer as the data line 300, the positional relationship between the second selection signal line 520 and the data line 300, and between the second selection signal line 520 and the sub-pixel 200 may be the same as that in the display panel shown in FIG. 5, for example, the extension direction of the second selection signal line 520 is the same as that of at least part of the data line 300, and the second selection signal line 520 is located between two adjacent sub-pixels 200 arranged in the first direction, and the two adjacent sub-pixels are respectively electrically connected with different data lines.

For example, in the display panel with transistors with top and bottom gate electrodes as shown in FIG. 13, upon the second selection signal line 520 being arranged in the same layer as the data line 300, it is possible to only providing the second sub-selection signal line in the first selection signal line, and the second sub-selection signal line is located between the active semiconductor layer and the base substrate, and extends in the X direction without overlapping the gate line, and is electrically connected to the second selection signal line.

For example, as shown in FIGS. 1A to 15, the active semiconductor layer can be electrically connected with the pixel electrode through a connection part (a square block overlapping with the pixel electrode in the figure) arranged in the same layer as the data line 300. The block of the overlapping part of the active semiconductor layer and the data line in the figure schematically shows the electrical connection relationship between the two, which can be the protruding part of the data line.

In the display panel with transistors with top and bottom gate electrodes as shown in FIG. 13, the first selection signal line is not limited to including the first sub-selection signal line and the second sub-selection signal line with different extension directions as shown in FIG. 13, and the first selection signal line may only include signal lines extending in the X direction, which may overlap with or be offset from the gate lines, and may be designed according to product requirements.

Figure 16:
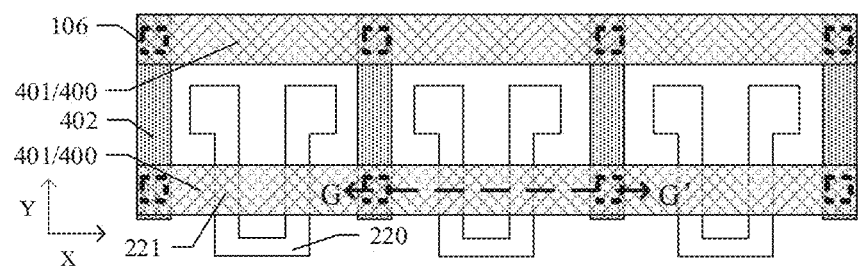
FIG. 16 is a schematic diagram of an overlapping relationship between an active semiconductor layer and a gate line in a display panel according to another example of an embodiment of the present disclosure.
Figure 17:
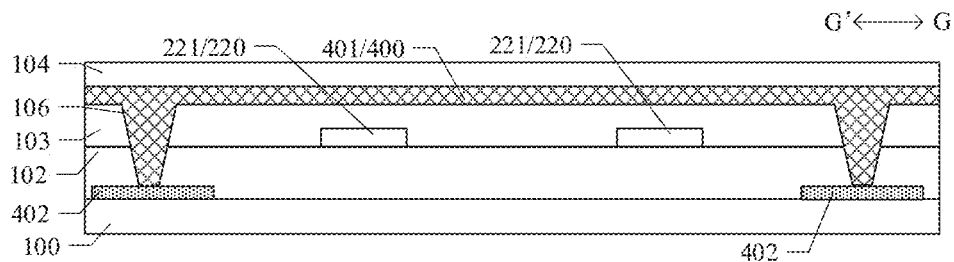
FIG. 17 is a schematic diagram of a partial cross-sectional structure taken along the GG' line shown in FIG. 16.

FIG. 16 is a schematic view of a partial plane structure of a display panel provided according to another example of an embodiment of the present disclosure, and FIG. 17 is a schematic diagram of a partial cross-sectional structure taken along the GG' line shown in FIG. 16. The display panels shown in FIGS. 16 and 17 are different from the display panels shown in FIGS. 1A to 15 in that the structure of the gate lines is different. In this example, the structures other than the gate lines can be the same as those in any of the above examples, and the details are not repeated here.

In some examples, as shown in FIG. 16 and FIG. 17, at least one gate line 400 includes two sub-gate lines 401 and at least one connection part 402 connecting the two sub-gate lines 401, the two sub-gate lines 401 are in the same layer and arranged in parallel, and the two sub-gate lines 401 and the connection part 402 are located in different layers, and the two sub-gate lines 401 included in each gate line 400 are electrically connected through the connection part 402. In the direction perpendicular to the base substrate 100, one of the two sub-gate lines 401 overlaps the first portion 221 of the active semiconductor layer 220. By arranging the gate line to include a sub-gate line overlapping the active semiconductor layer and a sub-gate line not overlapping the active semiconductor layer, and the two sub-gate lines are electrically connected, it is beneficial to reducing the resistance of the gate lines. In addition, by arranging the sub-gate lines and the connection parts in different layers, compared with the arrangement of sub-gate lines electrically connected with each other in the same layer, it can prevent the problems of the etching liquid being blocked by the closed ring formed by the gate line layer without flowing out, which further leading to uneven etching and tail-up of current-voltage curve.

For example, as shown in FIGS. 16 and 17, the connection part 402 may be located between the gate line 400 and the base substrate 100. For example, the connection part 402 may be located on the same layer as the light shielding layer as mentioned above. For example, in the direction perpendicular to the base substrate 100, at least part of the connection part 402 may overlap with the data line 300.

For example, as shown in FIGS. 16 and 17, the line widths of the two sub-gate lines 401 may be the same or different. For example, the line width of the sub-gate line 401 overlapping with the active semiconductor layer 220 may be larger than that of the sub-gate line 401 not overlapping with the active semiconductor layer 220 to reduce the gate line resistance and save layout space.

For example, as shown in FIGS. 16 and 17, the connection part 402 does not overlap with the active semiconductor part 220 in the direction perpendicular to the base substrate 100.

For example, as shown in FIG. 17, an insulating layer 102 and an insulating layer 103 are provided between the sub-gate line 401 and the connection part 402, and the sub-gate line 401 is electrically connected with the connection part 402 through a via hole 106 penetrating through the insulating layer 102 and the insulating layer 103.

For example, one connection part 402 is provided between adjacent active semiconductor layers 220 arranged in the X direction. For example, all the connection parts 402 provided between adjacent sub-gate lines 401 may be electrically connected to the sub-gate lines 401. The embodiment of the present disclosure is not limited to setting one connection part between the active semiconductor layers of adjacent sub-pixels, but it also possible to only set a connection part between the active semiconductor layers of adjacent sub-pixels in some sub-pixels. For example, in the case where the second selection signal line is arranged in the same layer as the connection part, the positions of the second selection signal line and the connection part can be designed as required.

For example, in this example, in the case where the second selection signal line is arranged in the same layer as the connection part 402, the second selection signal line is insulated from the connection part 402. For example, the connection part 402 may be provided at a position where the second selection signal line is not provided between adjacent sub-pixels.

The embodiment of the present disclosure is not limited to that the gate line 400 shown in FIGS. 16 and 17 includes two sub-gate lines electrically connected to each other, and it is possible that the first selection signal line includes two sub-lines electrically connected to each other to reduce the resistance of the selection signal line group.

Figure 18:
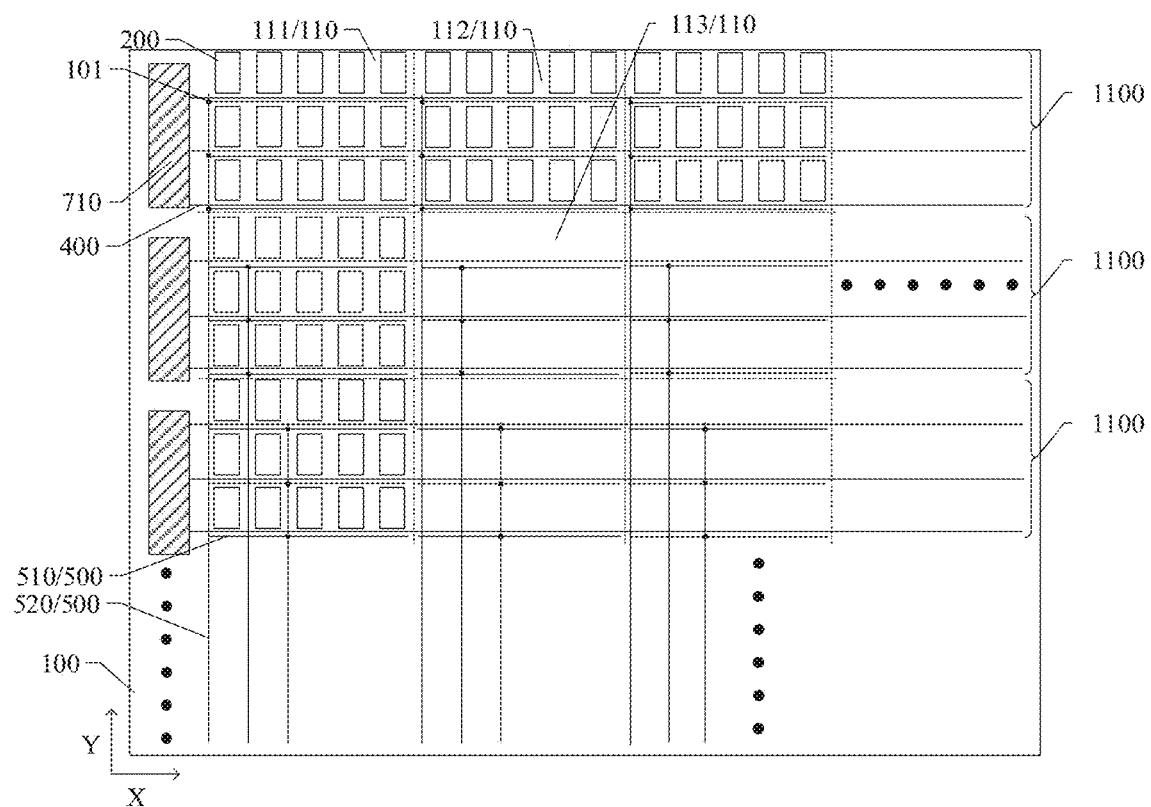
FIG. 18 is a schematic diagram of a partial plane structure of a display panel provided according to an example of an embodiment of the present disclosure.

FIG. 18 is a schematic diagram of a partial plane structure of a display panel provided according to an example of an embodiment of the present disclosure. The display panel shown in FIG. 18 includes the display subregion shown in FIG. 2. The arrangement of sub-pixels, the electrical connection relationships between the sub-pixels and the data lines, between the sub-pixels and the gate lines, and the characteristics of the selection signal line groups in the display panel shown in FIG. 18 can be the same as those in any example shown in FIGS. 1A to 17, and will not be repeated here again.

In some examples, as shown in FIG. 18, the display panel further includes a plurality of gate driver groups 710, which are arranged in the second direction, are electrically connected with the gate lines 400, and at least some of the gate driver groups 710 are configured to be individually input with a frame start signal. The plurality of display subregions 110 include a plurality of display subregion rows 1100 arranged in the second direction, each display subregion row 1100 includes display subregions 110 arranged in the first direction, and the plurality of gate driver groups 710 are electrically connected to the plurality of display subregion rows 1100 in one-to-one correspondence. In the display panel provided by the embodiment of the present disclosure, at least some the gate driver groups are separately input with the frame start signal, so that the display subregions in at least part of the plurality of display subregion rows can refresh the frequency independently.

For example, at least one gate driver group 710 includes a plurality of gate driving units (gate driver integrated on array substrate, GOA), and each gate driving unit can be electrically connected with one row of sub-pixels 200 to output a row scanning signal for driving the sub-pixels 200 of this row. For example, the gate driving unit may include voltage related signals, such as CLK and CLKB signal pair, an input signal (Input), a gate electrode off signal (Vss), a reset signal (Reset), and an output signal (Output) of the current row. For example, the gate driving unit may include a 4T1C (including four TFTs and one capacitor C) unit structure, an 8T1C (including eight TFTs and one capacitor C) unit structure and other structures.

Figure 19:
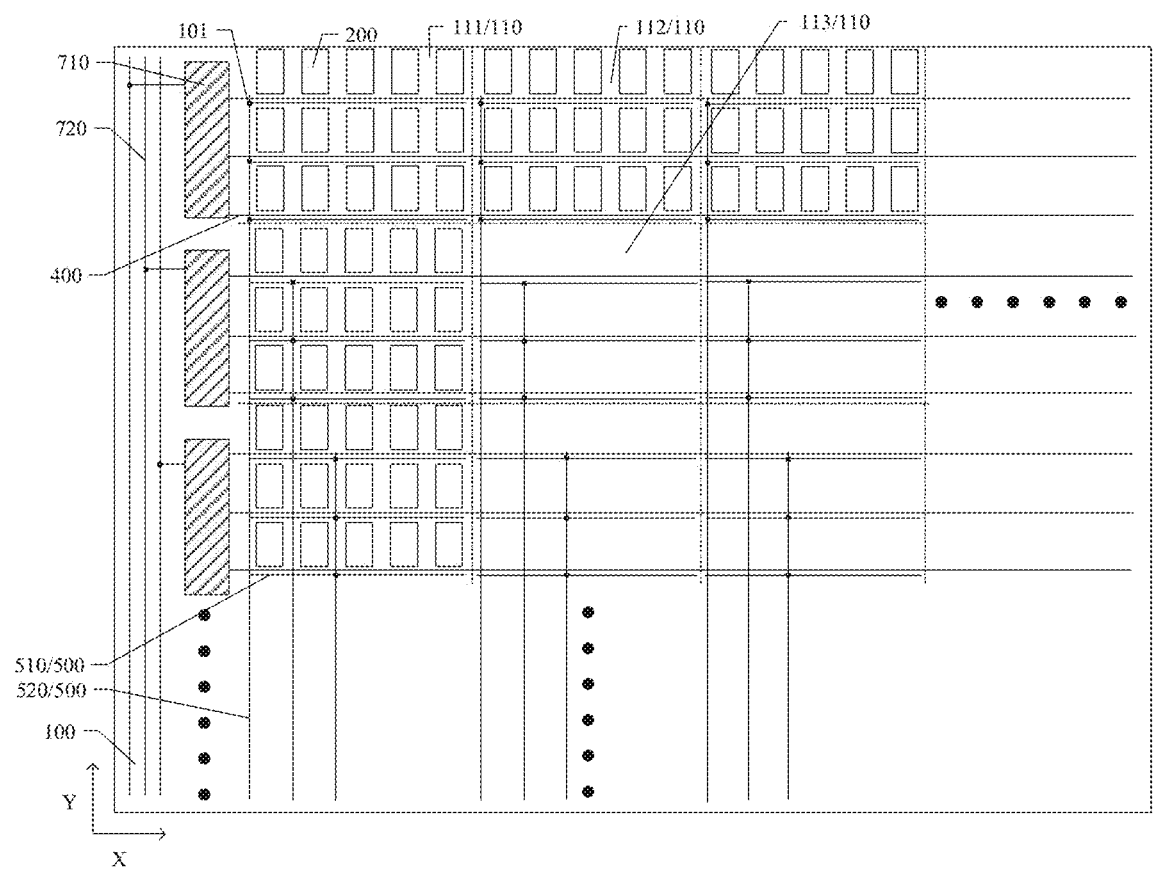
FIGS. 19 and 20 are schematic diagrams of an electrical connection relationship between the gate driver group and the frame start signal line in different examples of the display panel shown in FIG. 18.
Figure 20:
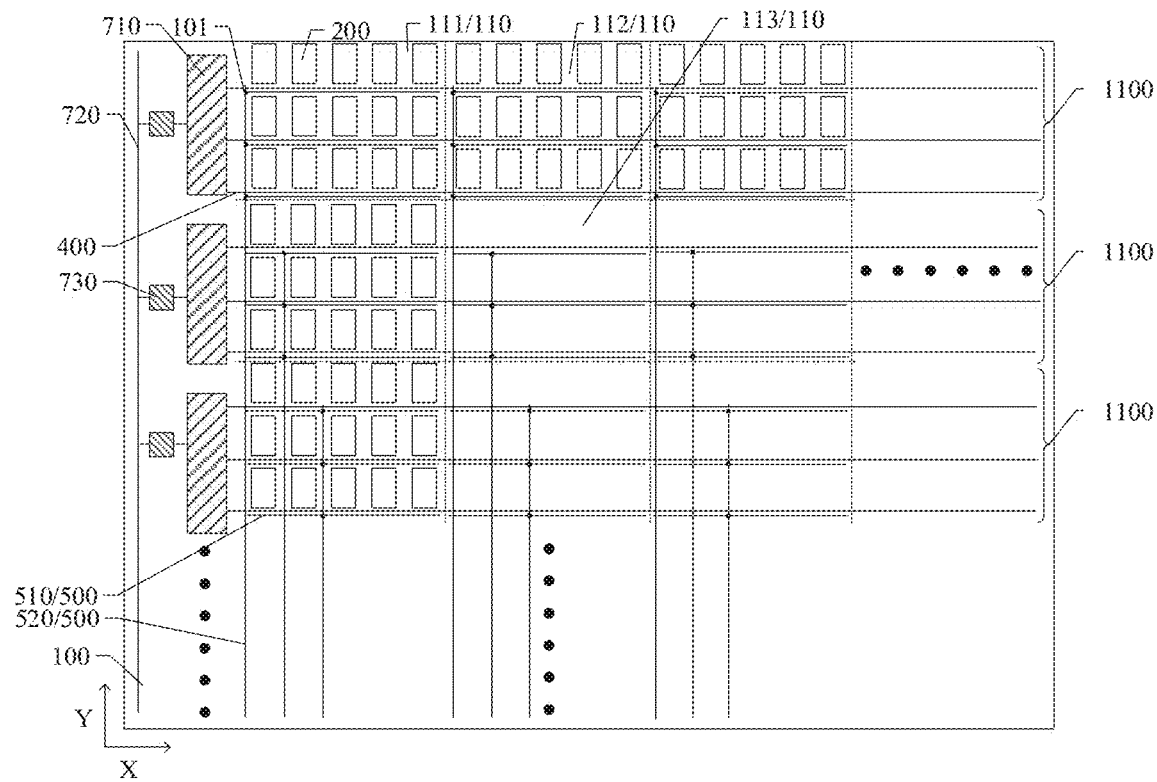

FIGS. 19 and 20 are schematic diagrams showing the electrical connection relationship between the gate driver group and the frame start signal line in different examples of the display panel shown in FIG. 18.

In some examples, as shown in FIG. 19, the display panel further includes a plurality of frame start signal lines 720, which are electrically connected to the plurality of gate driver groups 710 in one-to-one correspondence. For example, different gate driver groups 710 are electrically connected to different frame start signal lines 720. In the present example, by electrically connecting different gate driver groups with different frame start signal lines, each gate driver group can be independently input with a frame start signal, so that each display subregion row can be independently controlled without being influenced by other display subregion rows to realize partition control of the display panel.

In some examples, as shown in FIG. 20, the display panel further includes at least one frame start signal line 720, and a plurality of control units 730 are arranged between the plurality of gate driver groups 710 and the at least one frame start signal line 720, and the plurality of control units 730 are electrically connected with the plurality of gate driver groups 710 in one-to-one correspondence. For example, the number of control units 730 is the same as the number of gate driver groups 710, and each display subregion row 1100 is electrically connected to one control unit 730.

In some examples, as shown in FIG. 20, each frame start signal line 720 is electrically connected with at least two control units 730 of the plurality of control units 730 to input a frame start signal to at least two control units 730 of the plurality of control units 730. For example, the number of frame start signal lines 720 is smaller than the number of gate driver groups 710. For example, at least one frame start signal line 720 is configured to transmit a frame start signal to at least two gate driver groups 730.

This example is beneficial to reducing the number of pins of Chip On Film (COF) or pins of IC by setting the control units to reduce the number of frame start signal lines. For example, in a large-size display device, by setting the control units to reduce the number of frame start signal lines, the number of COF pins can be reduced, in a small-size display device, the number of pins of an IC can be reduced by setting a control unit to reduce the number of frame start signal lines. In addition, the CLK signal of GOA between subregions can still be shared, which does not affect the number of traces of the CLK signal.

In some examples, as shown in FIG. 20, at least one frame start signal line 720 includes only one frame start signal line, and one frame start signal line 720 is electrically connected with the plurality of control units 710 to individually input a frame start signal to each of the plurality of control units 710. In this example, one single frame start signal line is used to input the frame start signal to each control unit, which can greatly reduce the number of frame start signal lines.

Figure 21:
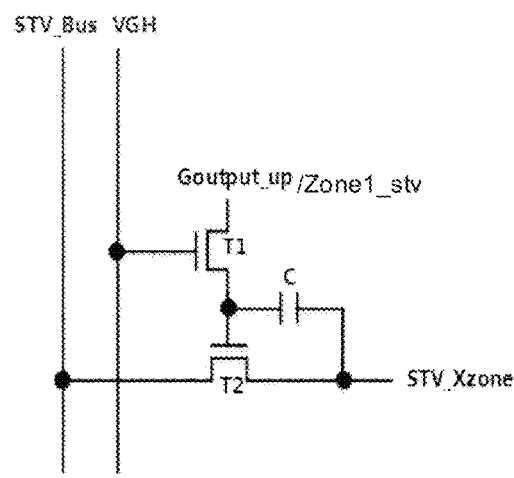
FIG. 21 is a circuit structure diagram of an example of a control unit shown in FIG. 20.

FIG. 21 is a circuit structure diagram of an example of the control unit shown in FIG. 20. For example, as shown in FIG. 21, the control unit 730 may include a 2T1C unit structure including a transistor T1, a transistor T2 and a capacitor C. For example, both the transistor T1 and the transistor T2 include a first electrode, a second electrode and a gate electrode, one of the first electrode and the second electrode is a source electrode and the other of the first electrode and the second electrode is a drain electrode.

For example, as shown in FIG. 21, the first electrode of the transistor T2 is electrically connected with the frame start signal line 720 (STV_Bus line shown in the figure), the second electrode of the transistor T2 is electrically connected with the corresponding gate driver group 710 (STV_Xzone shown in the figure), and the gate electrode of the transistor T2 is electrically connected with the second electrode of the transistor T1. The first electrode of the transistor T1 is electrically connected with other signal lines (such as an additional enable signal Zone1_stv provided from outside) or the last Goutput (Goutput_up in the figure) of the previous display subregion row, and the gate electrode of the transistor T1 is connected with the control signal VGH. For example, the transistor T2 is used for inputting of STV bus signal, and the transistor T1 is used for reducing leakage current and controlling STV writing. Capacitor C is used for charge storage and voltage bootstrap, which makes the transistor T2 fully open. For example, the transistor T1 may share other VGH voltages on the display panel.

For example, as shown in FIGS. 20 and 21, the gate electrodes of the transistors T1 in all control units 730 may be connected to the same control signal VGH, and this VGH voltage may be shared with the VGH voltage in the GOA unit.

Figure 22:
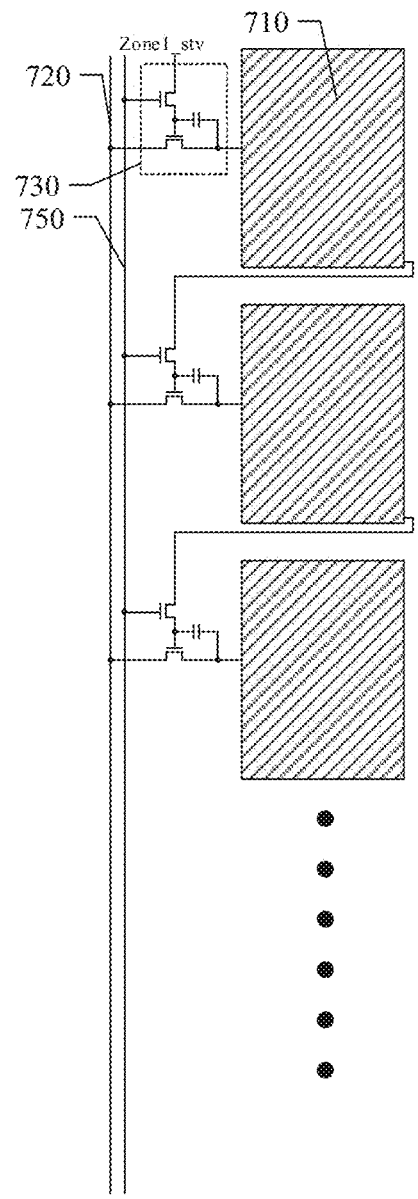
FIG. 22 is a schematic diagram of the display panel shown in FIG. 20 including the control unit shown in FIG. 21.
Figure 23:
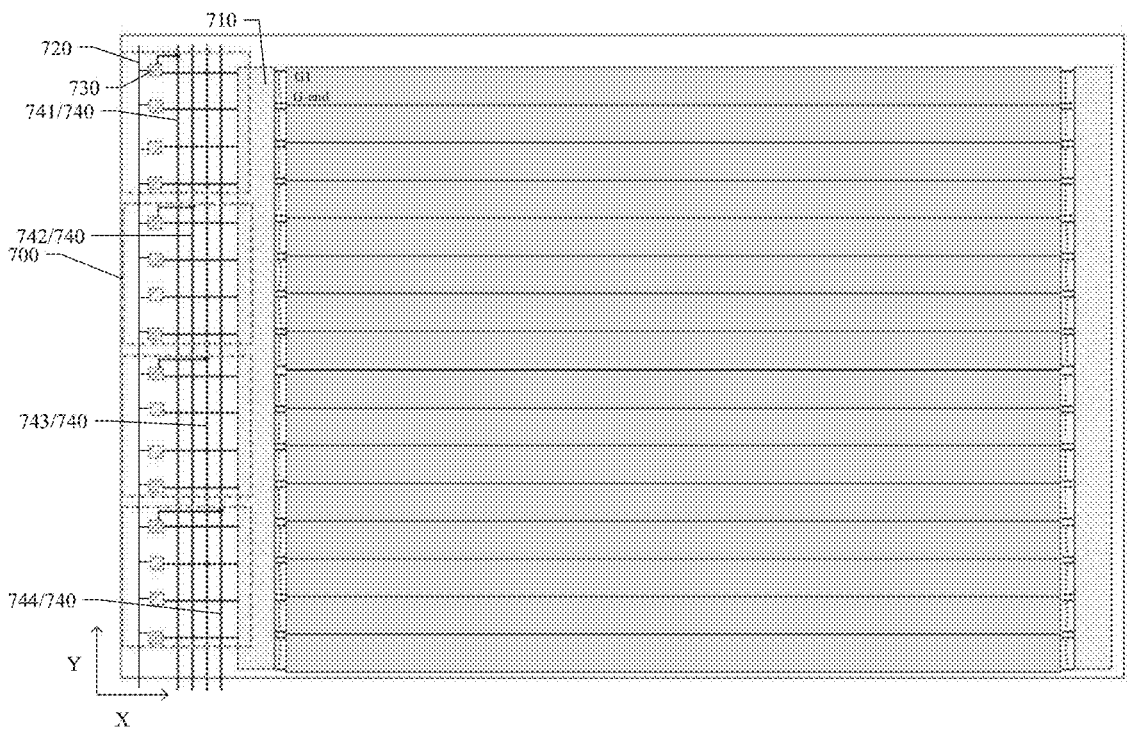
FIG. 23 is a schematic diagram of a display panel including a connection relationship between the control unit and the frame start signal line shown in FIG. 22.

FIG. 22 is a schematic diagram of the display panel shown in FIG. 20 including the control unit shown in FIG. 21. FIG. 23 is a schematic diagram of a display panel including a connection relationship between the control unit and the frame start signal line shown in FIG. 22.

For example, as shown in FIGS. 21 to 23, the gate electrodes of the transistors T1 in all the control units 730 can be connected to the control signal line 750 to receive the control signal VGH, the same frame start signal line 720 can be electrically connected to a plurality of control units 730, and the first electrode of the transistor T1 of the first control unit 730 is connected to the enable signal Zone1_stv, the first electrode of the transistor T1 of the second control unit 730 is electrically connected with the last GOUT of the first display subregion row, and the first electrode of the transistor T1 of the third control unit 730 is electrically connected with the last GOUT of the second display subregion row, and so on.

For example, as shown in FIG. 23, the display panel includes one frame start signal line 720 and a plurality of enable signal lines 740. For example, a plurality of control units 730 can be divided into a plurality of control unit groups, each control unit group includes at least two control units 730, the first electrode of the transistor T1 of the first control unit 730 in each control unit group is connected with the enable signal line 740, and the first electrodes of the transistors T1 of other control units 730 in each control unit group except the first control unit 730 are connected to the last Goutput signal of the display subregion corresponding to the previous control unit. For example, the number of the control unit groups is four, the enable signal lines 740 may include four enable signal lines 741, 742, 743 and 744. The embodiment of the present disclosure schematically shows that different control unit groups are electrically connected with the same frame start signal line 720, but it is not limited thereto, and different control unit groups may also be electrically connected with different frame start signal lines.

For example, the plurality of control units 730 can be divided into a plurality of control unit groups 700, each control unit group 700 includes at least one control unit 730, and each control unit group 700 is electrically connected with one frame start signal line 720, and different control unit groups 700 are electrically connected with different frame start signal lines 720.

For example, the display subregion rows corresponding to the control unit groups 700 electrically connected to different frame start signal lines 720 can be independently controlled without being influenced by the display subregion rows corresponding to other frame start signal lines 720.

Figure 24:
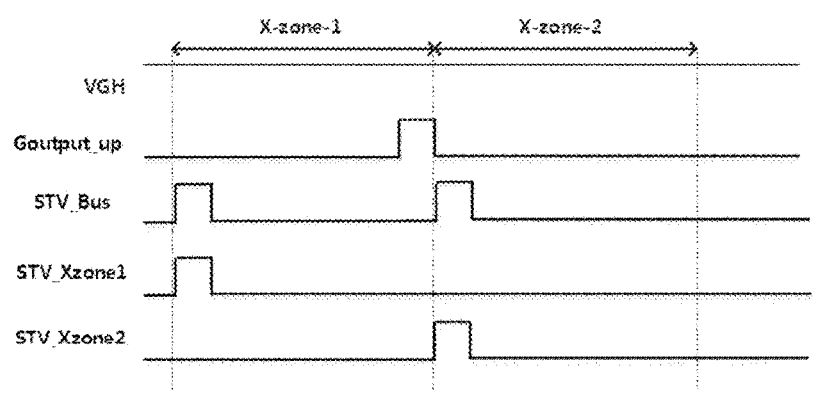
FIG. 24 is a timing chart corresponding to a circuit structure of the control unit shown in FIGS. 21 and 22.

FIG. 24 is a timing chart corresponding to a circuit structure of the control unit shown in FIGS. 21 and 22. For example, as shown in FIGS. 21 to 24, the control signal VGH is at a constant high level, and the transistor T1 of each control unit 730 is at a constant On state. When the enable signal Zone1_stv is at a high level, the transistor T2 is turned on. When the enable signal STV_Bus is at a high level, the first gate driver group 710 is transmitted with the signal STV_Xzone1 through the transistor T2 which is in the On state of the first control unit 730; when the first electrode of the transistor T1 of the second control unit 730 receives the control signal Goutput_up, the transistor T2 of the second control unit 730 is turned on, and the enable signal STV_Bus is at the high level again, the second gate driver group 710 receives the signal STV_Xzone2 through the transistor T2 which is in the On state of the second control unit 730.

For example, the types of the transistor T1 and the transistor T2 can be selected according to the control signal, and can be n-type metal-oxide-semiconductor (NMOS) transistors, but not limited thereto. It can also be a p-type metal-oxide-semiconductor (PMOS) transistor or a complementary metal-oxide-semiconductor (NMOS) transistor, which is not limited by the embodiment of the present disclosure.

Figure 25:
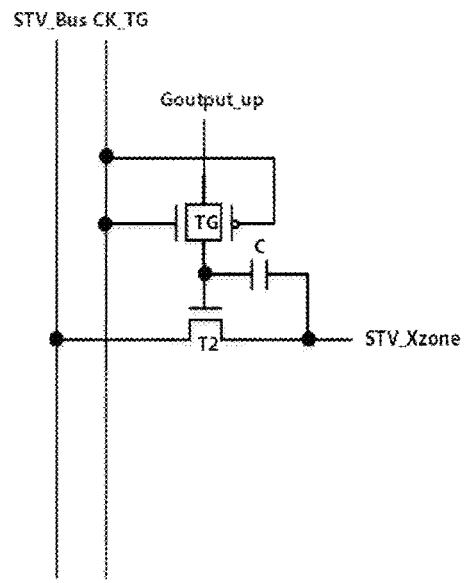
FIG. 25 is another circuit structure diagram of the control unit.
Figure 26:
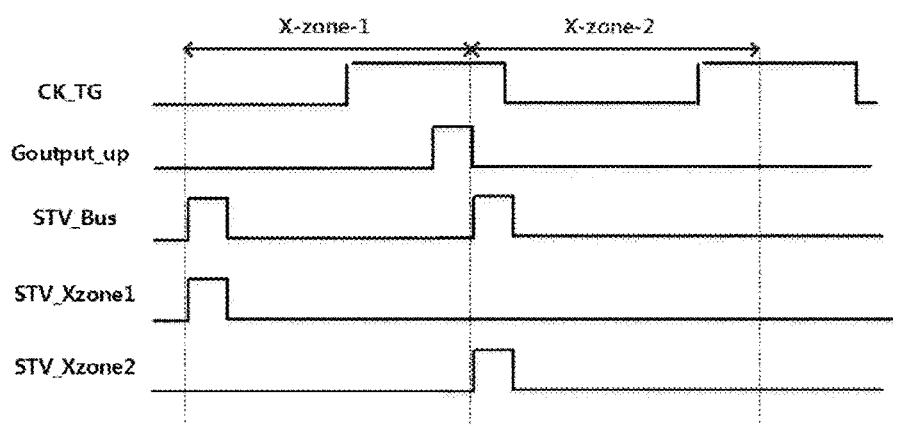
FIG. 26 is a timing chart of the circuit structure diagram shown in FIG. 25.

FIG. 25 is another circuit structure diagram of the control unit, and FIG. 26 is a timing chart of the circuit structure diagram shown in FIG. 25. The circuit structure shown in FIG. 25 is different from that shown in FIG. 21 in that the transistor T1 is replaced by a transmission gate TG, and the control signal VGH of the transistor T1 is replaced by a CK_TG signal (such as a clock signal). The CK_TG signal needs to match the timing of each partition, and the transmission gate TG includes one NMOS transistor and one PMOS transistor.

For example, as shown in FIG. 26, when the enable signal Zone1_stv is at a high level, the transistor T2 is turned on; when the enable signal STV_Bus is at a high level, the first gate driver group 710 is transmitted with the signal STV_Xzone1 through the transistor T2 in an On state of the first control unit 730; when the CK_TG signal is at a high level, the transmission gate TG of the second control unit receives the control signal Goutput_up, the transistor T2 of the second control unit is turned on, and the enable signal STV_Bus is at a high level again, the second gate driver group 710 receives the signal STV_Xzone2 through the transistor T2 in an On state of the second control unit 730.

For example, when Goutput-up is at a high level, STV-_Bus is at a low level, and when STV_Bus is at a high level again, STV_Xzone2 is at a high level, so STV_Xzone2 and Goutput-up can have a difference of 1H (time required for scanning one line, for example, when the display device scans 60 frames of images in one second and each frame of images includes 1080 lines of images. 1H=1/60/1080 second) or a plurality of Hs.

Figure 27:
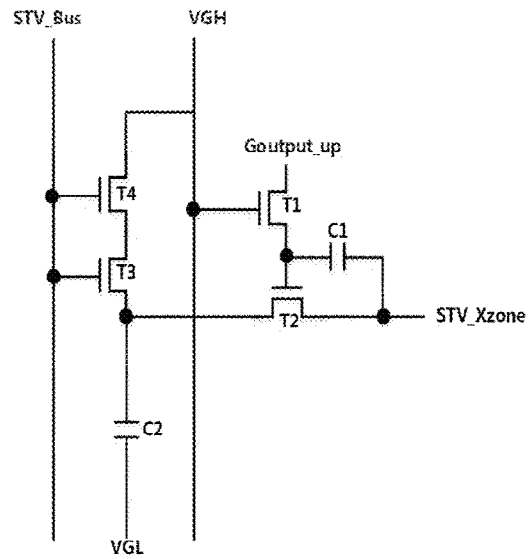
FIG. 27 is another circuit structure diagram of the control unit.
Figure 28:
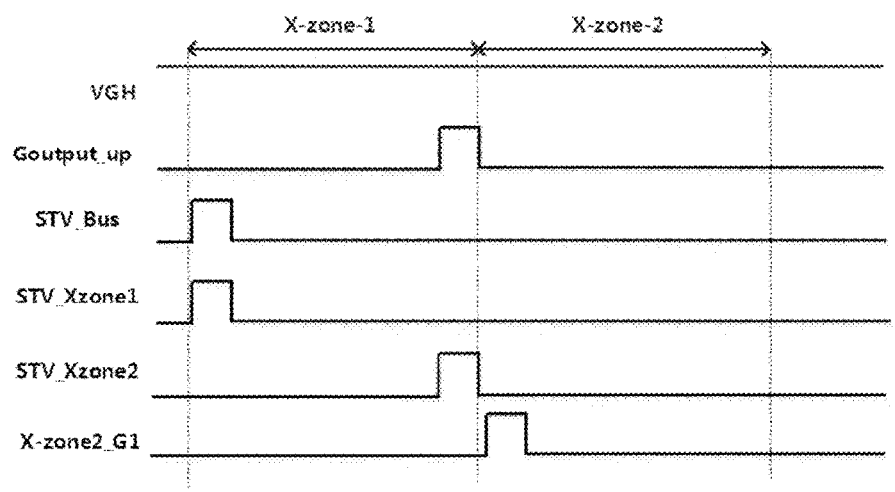
FIG. 28 is a timing chart of the circuit structure diagram shown in FIG. 27.

FIG. 27 is another circuit structure diagram of the control unit, and FIG. 28 is a timing chart of the circuit structure diagram shown in FIG. 27. The circuit structure shown in FIG. 27 is different from the circuit structure shown in FIG. 21 in that two transistors T3 and T4 and a capacitor C2 are added to temporarily store the enable signal configured to be transmitted to the gate driver group in the capacitor C2, and only one initial signal STV_bus is provided per frame. In addition, the use of two transistors T3 and T4 is beneficial to reducing the leakage current and reduce the complexity of the control signal.

For example, as shown in FIG. 27, the frame start signal line is electrically connected with the gate electrode of transistor T3 and the gate electrode of transistor T4 to provide the gate control signals for the two transistors. The first electrode of the transistor T4 is connected with the VGH signal, the second electrode of the transistor T4 is connected with the first electrode of transistor T3, the second electrode of the transistor T3 is connected with one electrode of the capacitor C2, and the other electrode of the capacitor C2 is connected with the VGL signal. The second electrode of the transistor T3 is connected with the first electrode of the transistor T2.

For example, as shown in FIG. 28, the control signal VGH is at a constant high level, the transistor T1 of each control unit is at a constant On state, and when the enable signal on the frame start signal line is at a high level, the transistors T3 and T4 are at an On state, and the control signal VGH is stored in the capacitor C2 as an STV_bus signal; when the enable signal Zone1_stv is at a high level, the transistor T2 is turned on; when the enable signal STV_Bus is at a high level, the first gate driver group 710 is transmitted with the signal STV_Xzone1 through the transistor T2, which is in an On state, of the first control unit 730; when the signal Goutput_up is at a high level, the first electrode of the transistor T1 of the second control unit receives the control signal Goutput_up, the transistor T of the second control unit is turned on, and the enable signal STV_Bus stored in the capacitor C2 transmits a signal to the second gate driver group through the transistor T2 of the second control unit, so that the second gate driver group receives the signal STV_Xzone2.

For example, as shown in FIG. 28, X-zone2_G1 refers to the Goutput1 signal output by the second gate driver group. The circuit structure shown in FIG. 27 stores the enable signal in the capacitor C2 in advance, and when the Goutput_up signal is at a high level, STV-xone2 immediately outputs a high level.

For example, the transistor T1 shown in FIG. 27 can be replaced with the transfer gate TG shown in FIG. 25.

Figure 29:
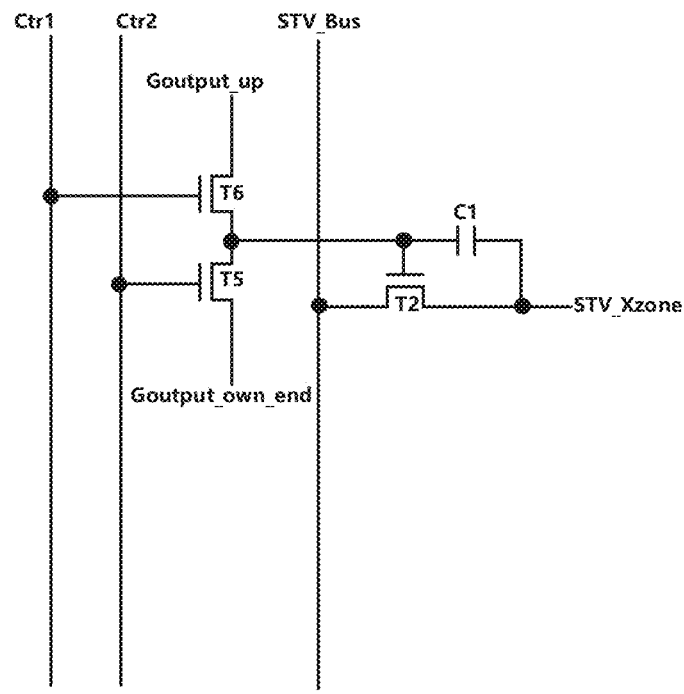
FIG. 29 is another circuit structure diagram of the control unit.
Figure 30:
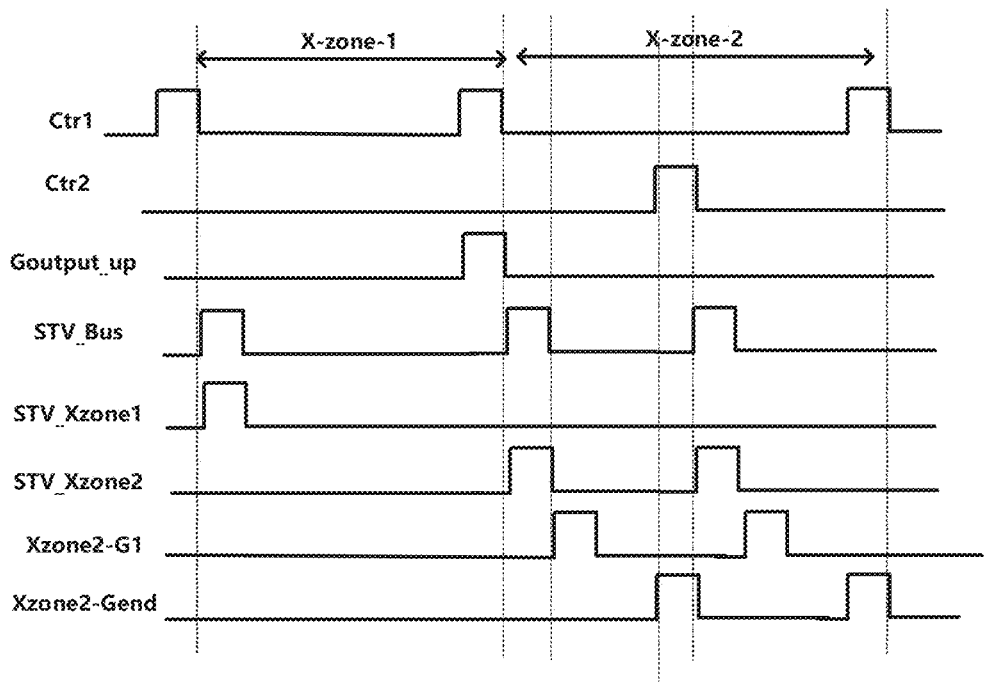
FIG. 30 is a timing chart of the circuit structure diagram shown in FIG. 29.

FIG. 29 is another circuit structure diagram of the control unit, and FIG. 30 is a timing diagram of the circuit structure diagram shown in FIG. 29. The circuit structure shown in FIG. 29 only includes the transistor T2 and the capacitor C1 shown in FIG. 21.

For example, as shown in FIG. 29, the circuit structure also includes a transistor T5 and a transistor T6, the gate electrode of the transistor T5 is connected with Ctr2 signal, the first electrode of the transistor T5 is connected with the second electrode of the transistor T6, the second electrode of the transistor T5 is connected with Goutput_own_end signal, the gate electrode of the transistor T6 is connected with Ctr1 signal, the first electrode of the transistor T6 is connected with Goutput_up signal or enable signal Zone1_stv, and the gate electrode of the transistor T2 is connected with the first electrode of the transistor T5. Goutput_up is the signal of the last row output by the GOA corresponding to the previous display subregion, and Goutput_own_end is the signal of the last row output by the GOA corresponding to the present display subregion.

The circuit structure provided by this example can be adapted to the change of the refresh rate of some display subregions of the display panel, for example, the location of the gaze region (described later) can achieve a high refresh rate.

For example, as shown in FIG. 30, the Ctr1 signal and the Ctr2 signal are of high level at different times, so the transistor T5 and the transistor T6 are not turned on at the same time, and when the transistor T5 is in the On state, the transistor T6 is in the Off state; when the transistor T5 is in the Off state, the transistor T6 is in the On state.

For example, when the Ctr1 signal is at a high level, the transistor T6 of the first control unit is turned on, the enable signal Zone1_stv received by the first electrode of the transistor T6 is at a high level, and the transistor T2 of the first control unit is turned on, and the enable signal STV_Bus is at a high level, the second electrode of the transistor T2 of the first control unit transmits the signal STV_Xzone1 to the first gate driver group; when the Ctr1 signal is at a high level, the transistor T6 of the second control unit is turned on, the Goutput_up signal received by the first electrode of the transistor T6 is at a high level, and the transistor T2 of the second control unit is turned on. When the enable signal STV_Bus is at a high level again, the second electrode of the transistor T2 of the second control unit transmits the signal STV_Xzone2 to the second gate driver group. The X-zone2-G1 signal output by the second gate driver group to the first GOA is at a high level, and then the second row of display subregions is scanned normally. After the second row of display subregions is scanned, the Ctr2 signal is at a high level, the Goutput_own_end (Xzone2-Gend in the figure) is at a high level, and the STV_Bus is at a high level again (that is, STV-Xzone2 is output as a high level again), the second row of the display subregions is scanned again.

For example, if a display subregion wants to achieve a high refresh rate, the Ctr2 signal is set as high level before the Gend signal (such as Xzone2-Gend, Xzone3-Gend, etc.) is output.

For example, as shown in FIG. 29 and FIG. 30, if X-zone2 is refreshed twice, when the last line of the first refreshing is output, Ctr1 is set to low level and Ctr2 is set to high level. At this time, the gate electrode of the transistor T2 is at a high level, and with the high level of STV-bus signal, X-zone2 partition can be provided with an enable signal again and refreshed again.

Figure 31:
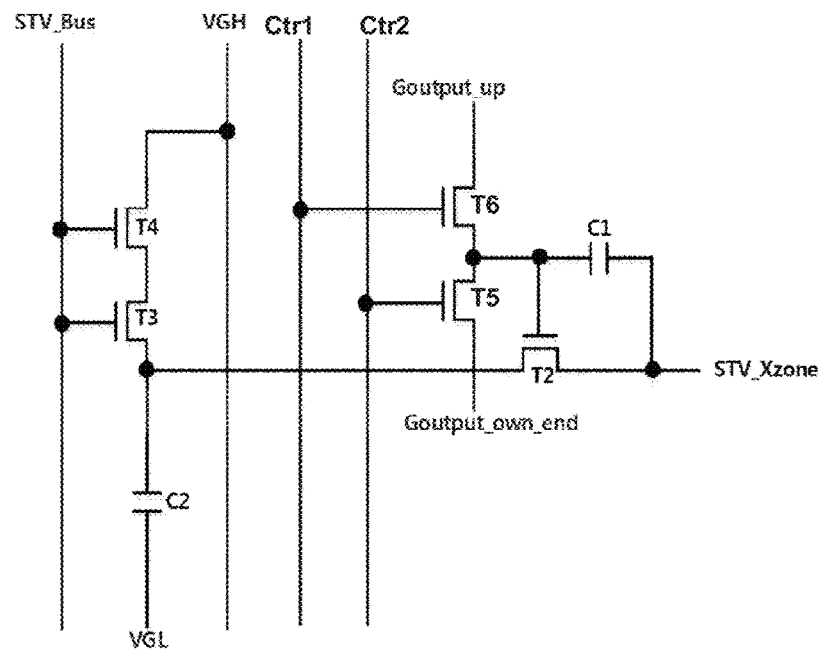
FIG. 31 is a schematic diagram of a circuit structure combining a part of the circuit structure shown in FIG. 27 and a part of the circuit structure shown in FIG. 29.

FIG. 31 is a schematic diagram of a circuit structure combining a part of the circuit structure shown in FIG. 27 and a part of the circuit structure shown in FIG. 29, which includes the transistor T2, the transistor T3, the transistor T4, the capacitor C1 and the capacitor C2 in the circuit structure shown in FIG. 27, and the transistor T2, the transistor T5, the transistor T6 and the capacitor C1 in the circuit structure shown in FIG. 29. The circuit structure shown in FIG. 31 has the corresponding features of FIGS. 27 and 29, and the effects of the circuit structure shown in FIGS. 27 and 29 can be achieved.

The example in which the circuit structures shown in FIG. 25, FIG. 27, FIG. 29 and FIG. 31 are applied in the control unit 730 shown in FIG. 22 is described, but the embodiments of the disclosure are not limited thereto, and these circuit structures can also be applied to a display panel in which the control unit does not receive the last row signal of the previous stage gate driver group.

The circuit structures shown in FIG. 25, FIG. 27, FIG. 29, and FIG. 31 only schematically show the circuit structure applied to the control unit that can realize partition display, and the control unit can also adopt other circuit structures.

The embodiment of the present disclosure adopts the combination of the gate driving mode shown in FIG. 18 to FIG. 31 and the selection signal line group shown in FIG. 1A to FIG. 15, which can realize the high refresh rate of the display subregions arrayed along the row direction and the column direction, and is beneficial to reducing the power consumption of the display panel.

Figure 32:
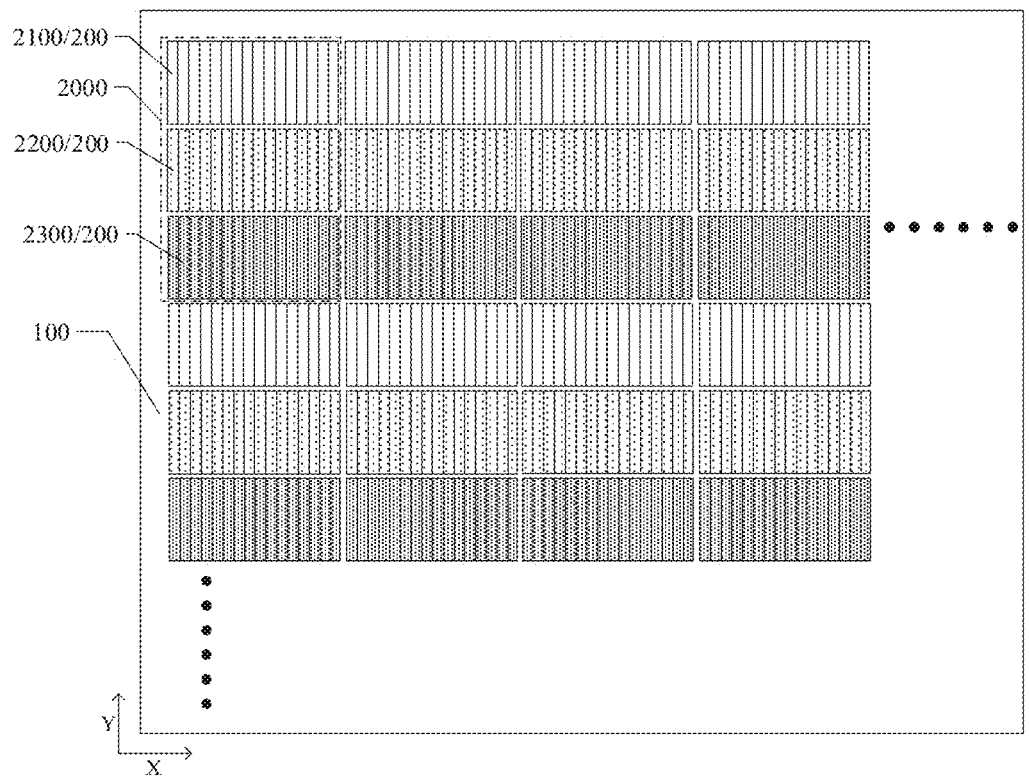
FIG. 32 is a schematic diagram of a partial plane structure of a display panel provided according to an embodiment of the present disclosure.

FIG. 32 is a schematic diagram of a partial plane structure of a display panel provided according to an embodiment of the present disclosure. The display panel shown in FIG. 32 can be the display panel in any of the above examples. For example, as shown in FIG. 32, the display panel includes a plurality of pixel islands 2000, and each pixel island 2000 includes a plurality of sub-pixels 200.

For example, each pixel island 2000 includes a plurality of first color sub-pixels 2100, a plurality of second color sub-pixels 2200, and a plurality of third color sub-pixels 2300. For example, each of the first color sub-pixels 2100, each of the second color sub-pixels 2200, and each of the third color sub-pixels 2300 may include a red sub-pixel, a green sub-pixel, and a blue sub-pixel, respectively. For example, in each pixel island 2000, sub-pixels of the same color are arranged in a first direction, and sub-pixels of different colors are arranged in a second direction. Of course, the embodiment of the present disclosure is not limited thereto, and the arrangement of sub-pixels in the pixel island can be set according to product requirements.

For example, as shown in FIG. 32, each pixel island 2000 may include 16 first color sub-pixels 2100, 16 second color sub-pixels 2200 and 16 third color sub-pixels.

For example, two rows and six columns of sub-pixels shown in FIG. 3 can be sub-pixels in the same pixel island. For example, two rows and six columns of sub-pixels shown in FIG. 4 can be sub-pixels in the same pixel island.

Figure 33:
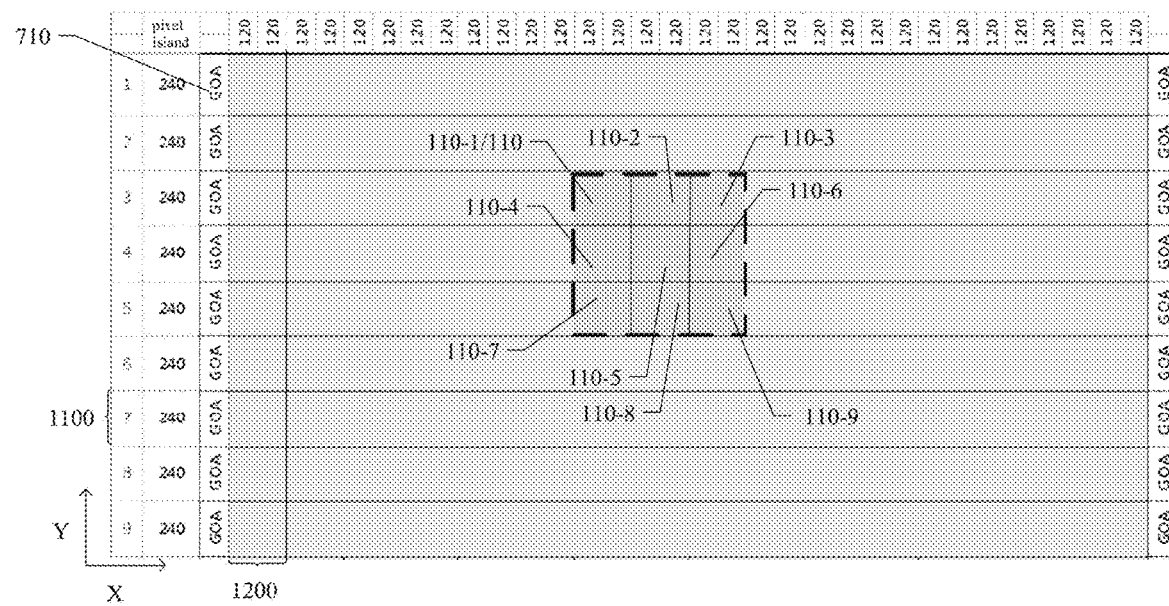
FIG. 33 is a schematic diagram of display subregions of the display panel provided according to the embodiment of the present disclosure.

FIG. 33 is a schematic diagram of display subregions of the display panel provided according to the embodiment of the present disclosure. The display panel shown in FIG. 33 can be any of the above examples. For example, as shown in FIG. 33, the display panel includes 9 display subregion rows 1100 and 16 display subregion columns 1200, that is, it includes 144 display subregions 110. For example, each display subregion row 1100 may include 240 rows of pixel islands, and each display subregion column 1200 may include 240 columns of pixel islands. For example, the number of pixel islands can be 3840*2160.

For example, each display subregion row 1100 is electrically connected to one gate driver group 710, and every two display subregion columns 1200 are electrically connected to a chip on film (COF).

For example, as shown in FIG. 33, the size of the display surface of the display panel may be 32 inches, and the display panel has 4k resolution.

Of course, the embodiment of the present disclosure is not limited thereto, and the display panel can also include 12 display subregion rows and 16 display subregion columns, that is, the display panel including 192 display subregions, etc., which can be set according to product requirements.

For example, as shown in FIG. 33, the display panel includes nine high-definition display subregions 110-1, 110-2, 110-3, 110-4, 110-5, 1106, 110-7, 110-8 and 110-9, and the display subregions other than these nine high-definition display subregions 110 can be low-definition displays.

At present, the resolution and refresh rate of monitors are getting higher and higher, and the current methods are all line-sequence refresh. This full-screen display method requires a lot of display data, it will bring great challenges to content generation and data transmission when the screen resolution and refresh rate continue to be improved. At the same time, due to the limitation caused by the gaze characteristics of human eyes, if the gaze point region of human eyes is located at the bottom of the screen, the screen needs to refresh the content that is not concerned by human eyes before it can refresh to the line that human eyes pay attention to, which brings high delay problem.

By adopting the cooperation of the selection signal line group and the gate driver group, a high refresh rate can be achieved only for 9 display subregions 110 in 144 display subregions 110 in FIG. 33, and it is not necessary to refresh the contents that are not of concern to human eyes before these 9 display subregions 110, so as to realize intelligent partition display and greatly reduce the hardware requirements for content rendering and transmission. The above-mentioned "intelligent partition" can refer to the partition design realized by the selection signal group in the display panel combined with the control of system signals, so as to achieve the purpose of local refresh or scanning independently.

In the research, the inventors of this application also found that the current display is mainly two-dimensional (2D) plane display, which generally can't allow users to obtain real three-dimensional information, but can only obtain the surface information of the object at a certain angle. The existing 2D display technology can no longer meet the requirements in some industrial fields with high spatial stereoscopic effect, such as 3D design, 3D games, 3D medical surgery and so on. With the rapid development of science and technology, light field display has gradually become the mainstream development trend of display industry.

Light field display is a three-dimensional (3D) display technology, which restores the light of the real scene through 3D display equipment, so that people can watch very realistic 3D display images. In order to achieve a 3D effect similar to a real scene, 3D display devices need to be able to restore light from all angles in space, which requires high resolution of display devices. However, too high display resolution will bring great challenges to content rendering, transmission and screen driving.

An embodiment of the present disclosure provides a display device, which includes an eye tracker, a content generation unit, a data processing part, and a display panel in any of the examples shown in FIGS. 1A to 33. The content generating unit is electrically connected with the eye tracker, the data processing part is electrically connected with the content generating unit; the display panel is electrically connected with the data processing part. The eye tracker is configured to determine a gaze point position, on a display surface of the display panel, corresponding to an eyeball by tracking the position of the eyeball, and the gaze point position is located in a first region of the display surface, and the display surface further includes a second region outside the first region, and the first region includes at least one display subregion. The content generating unit is configured to generate adjustment data according to the gaze point position. The data processing part is configured to generate display data according to the adjustment data. The display panel receives the display data to adjust a display resolution of an image displayed in the first region to be greater than that of an image displayed in the second region.

The display device provided by the embodiment of the present disclosure adopts the intelligent partition light field display technology based on the characteristics of human eyes, captures the fovea viewing requirements of human eyes through eye tracking technology, generates and transmits 3D content, and performs intelligent partition display at the display end, so that the high refresh rate and high resolution of the first region where the gaze point position is located can be realized under the condition of meeting the viewing requirements of human eyes, and the hardware requirements for content rendering, transmission and displaying and the system delay can be greatly reduced. In addition, the 3D light field display assigns different resolution ratios to the gaze point region where the gaze point position is located and the non-gaze point region, which is beneficial to matching different visual acuity in the user's field of vision.

Figure 34:
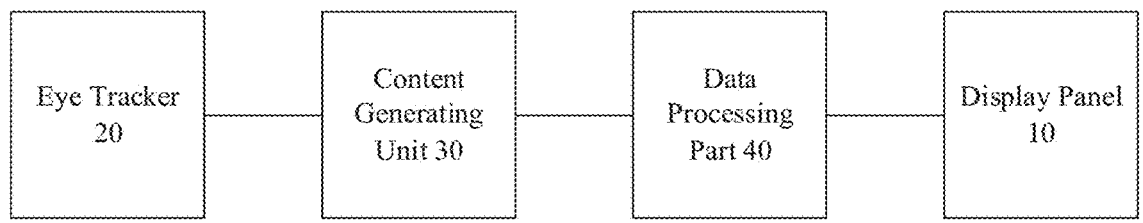
FIG. 34 is a structural block diagram of a display device provided according to an embodiment of the present disclosure.
Figure 35:
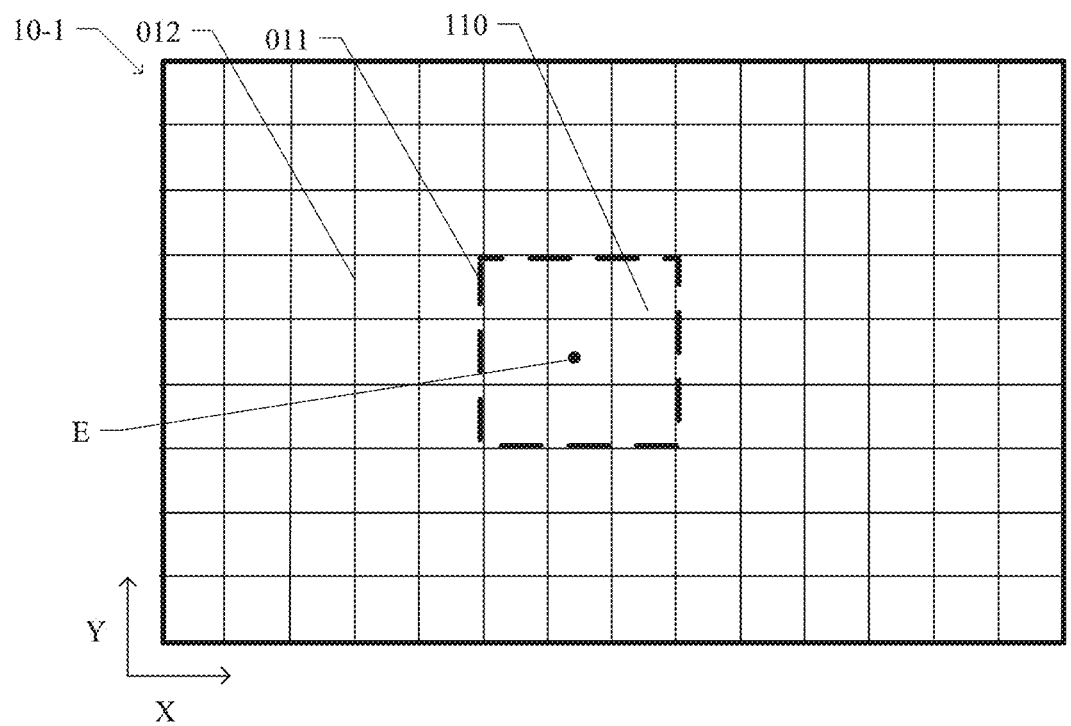
FIG. 35 is a schematic diagram of display subregions in a display surface of the display device shown in FIG. 34.

FIG. 34 is a structural block diagram of a display device provided according to an embodiment of the present disclosure, and FIG. 35 is a schematic diagram of display subregions in a display surface of the display device shown in FIG. 34. As shown in FIGS. 34 and 35, the display device includes an eye tracker 20, a content generation unit 30, a data processing part 40 and a display panel 10. The content generating unit 30 is electrically connected with the eye tracker 20, the data processing part 40 is electrically connected with the content generating unit 30, and the display panel 10 is electrically connected with the data processing part 40. The eye tracker 20 is configured to determine the gaze point position E on the display surface 10-1 of the display panel 10 corresponding to the eyeball by tracking the position of the eyeball. The gaze point position E is located in a first region 011 of the display surface 10-1, and the display surface 10-1 further includes a second region 012 outside the first region 011, and the first region 011 includes at least one display subregion 110. The display subregion 110 here is the display subregion 110 in the display panel in any of the above examples. The content generating unit 30 is configured to generate adjustment data according to the gaze point position E. The data processing part 40 is configured to generate display data according to the adjustment data. The display panel 10 receives the display data to adjust the display resolution of the image displayed in the first region 011 to be greater than that of the image displayed in the second region 012. For example, the first region 011 is a high definition region and the second region 012 is a low definition region. For example, the refresh rate of the first region 011 is higher than that of the second region 012.

The display device provided by the embodiment of the present disclosure adopts the intelligent partition light field display technology based on the characteristics of human eyes, captures the fovea viewing requirements of human eyes through eye tracking technology, generates and transmits 3D content, and performs intelligent partition display at the display end, which can greatly reduce the hardware requirements for content rendering, transmission and displaying under the condition of meeting the viewing requirements of human eyes. In addition, the 3D light field display assigns different resolution ratios to the gaze point region where the gaze point position is located, and the non-gaze point region, which is beneficial to matching different visual acuity in the user's field of vision.

For example, as shown in FIG. 35, the display surface 10-1 can include m rows of display subregions 110 and n columns of display subregions 110 to form m*n display subregions 110. By setting the selection signal line group and the gate driver group, each display subregion 110 can be controlled by an individual selection. For example, the first region 011 where the location E of the gaze point in the display surface 10-1 is located can be refreshed immediately, and the high-definition display of the gaze point of human eyes can be realized. In this way, the display delay can be reduced, and the bandwidth of data transmission can be reduced by displaying only the data of the gaze point region of human eyes.

When the human eye observes an object, the pupil and the crystalline lens image the object on the retina, and the image of the object is resolved by the retina and then the information is transmitted to the brain. The resolution of retina is also divided into different zones, the resolution of fovea region is the highest, and the resolution of the regions around fovea region decreases gradually. When the eyeball rotates, the object that the human wants to see clearly will be imaged in the fovea region of the retina, while the surrounding objects will be imaged around the fovea region of the retina, resulting in that the human eye can only see the objects in the gaze point region, but not the objects around the gaze point region. According to the characteristics of human eyes, when a user watches an image, a part of the image will be imaged in the fovea region of the human eye, while the other part of the image is in a blurred state because it is not imaged in the fovea region of the human eye. Therefore, the display device provided by the embodiment of the present disclosure can reduce the bandwidth of data transmission by displaying only the image of the human eye's gaze point region in high definition according to the location of the human eye's gaze point.

Figure 36:
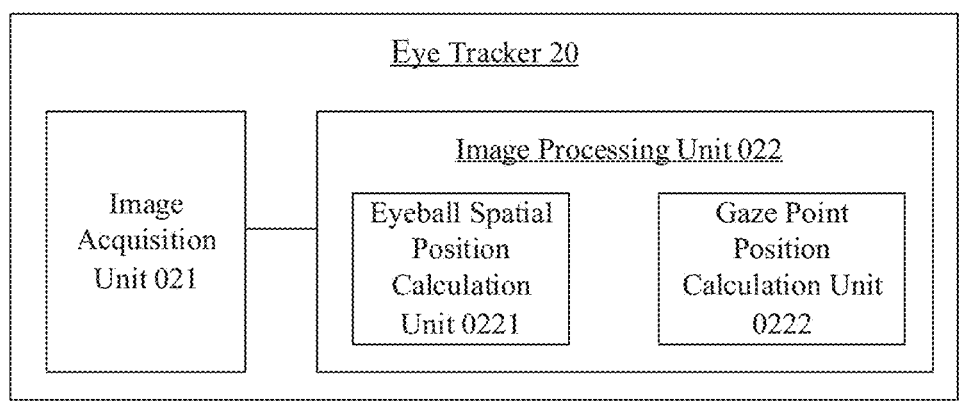
FIG. 36 is a structural block diagram of an eye tracker.

FIG. 36 is a structural block diagram of an eye tracker. For example, as shown in FIGS. 34 to 36, the eye tracker 20 includes an image acquisition unit 021 and an image processing unit 022 electrically connected to the image acquisition unit 021. For example, the image acquisition unit 021 is configured to acquire the position information of the eyeball, and the image processing unit 022 includes an eyeball spatial position calculation unit 0221 and a gaze point position calculation unit 0222. The image processing unit 022 receives the position information of the eyeball acquired by the image acquisition unit 021 and calculates the gaze point position E of the eyeball on the display surface 10-1 according to the position information of the eyeball.

For example, on the one hand, eye tracker is used to provide the position of human eyes relative to the screen in space (for example, it is used to determine the view that human eyes watch, reducing the amount of rendering data and rendering delay), on the other hand, it is used to provide the position of human eyes' gaze point on the display screen (for example, it is used to allow the concerned region where the gaze point by the human eyes is located subject to rendering in high definition, and the non-concerned region in low definition, reducing the amount of rendering data and rendering delay), and at the same time, it is used to determine the screen display subregion according to the gaze position.

For example, the image acquisition unit 021 may include a camera, which may be a color camera (such as an RGB camera) or an infrared camera, and the camera may be placed at the edge of the screen (such as below or above the display surface). In order to reduce the delay, the camera frame rate should be ≥120 FPS, and the number of cameras can be single or multiple, so as to capture clear human eye images.

For example, the infrared camera can include an infrared light source, which can be a ring light source with a plurality of infrared light emitting diodes. After the light emitted by the infrared light source irradiates the eyeball, it produces a reflection spot on the cornea of the eyeball. When the eyeball looks in different directions, the center of the pupil changes correspondingly with the direction of sight line, and the position of the corneal reflection point is fixed. The camera collects the light spots reflected by the eyeball to track the eyeball.

Figure 37:
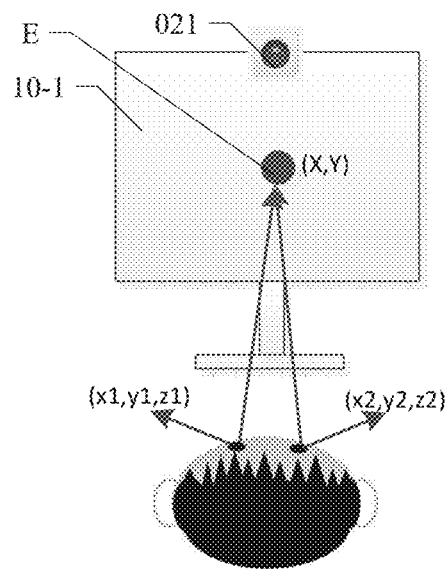
FIG. 37 is a schematic diagram in the case where a user watches the display device.

FIG. 37 is a schematic diagram in the case where a user watches the display device. For example, as shown in FIGS. 36 and 37, the image processing unit 022 extracts the pupil position in the face image according to the face image acquired in the image acquisition unit 021, and calculates the spatial coordinates (x1,y1,z1) and (x2, y2, z2) of the human eye relative to the image acquisition unit 021 based on the position of the image acquisition unit 021 relative to the human eye; through the calibration relationship between the pupil image coordinates and the screen, the coordinates (X,Y) of the eye's gaze point position E on the display surface 10-1 can be obtained.

For example, the image processing unit 022 can extract sight line characteristic parameters (such as pupil center and corneal reflection spot center) by using the characteristics of corneal reflection point, and the location of the sight line can be obtained by the corresponding gaze point estimation method, that is, the image processing unit 022 can obtain the position information of the eyeball gaze point position E in the display surface 10-1 by calculating the eyeball rotation angle, for example, the position information can be coordinate information. For example, according to the perimeter or radius of the region where the gaze point position E is located, the region centered on the coordinates of the gaze point position E can be divided, that is, the first region 011.

Figure 38:
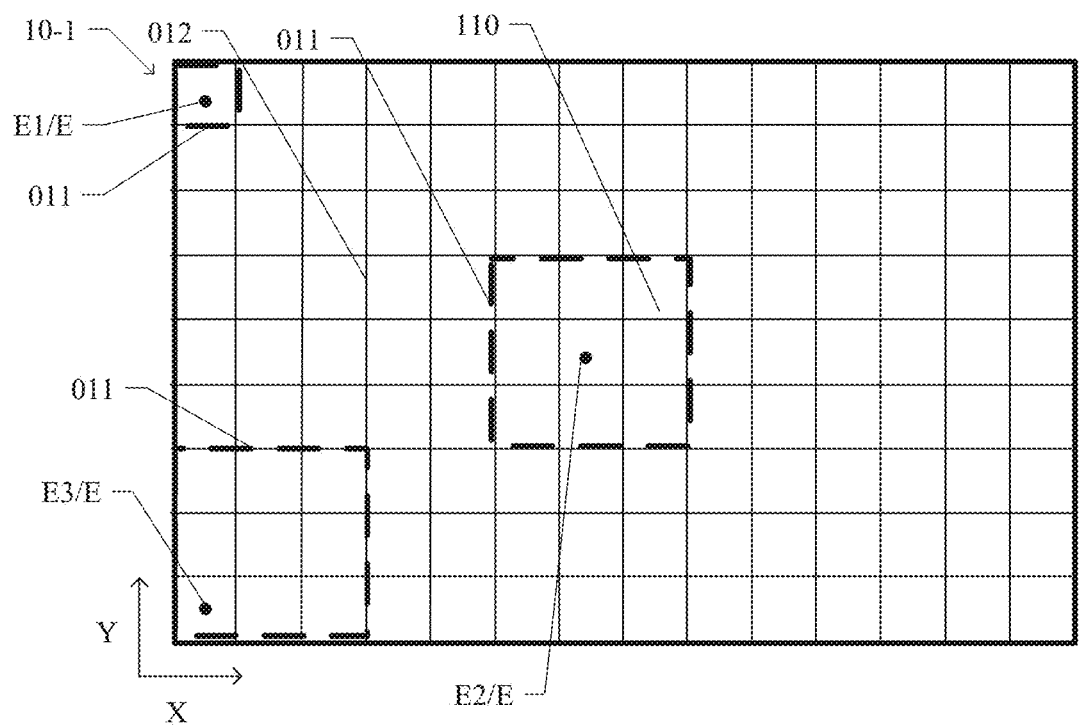
FIG. 38 is a schematic diagram of judging a first region in a display surface according to a gaze point position.

FIG. 38 is a schematic diagram of judging a first region in a display surface according to a gaze point position.

In some examples, as shown in FIG. 38, the first region 011 includes one display subregion 110, and the gaze point position E, such as E1, is located in the display subregion 110.

In some examples, as shown in FIG. 38, the gaze point position E, such as E2 or E3, is located in one display subregion 110, and the first region 011 includes other display subregions 110 surrounding one display subregion 110.

For example, as shown in FIG. 38, the gaze point E2 is located in one display subregion 110, and the display subregion 110 where the gaze point E2 is located may be located in the center of the first region 011. For example, the gaze point E3 is located in one display subregion 110, and the display subregion 110 where the gaze point E3 is located may be located in a corner position of the first region 011.

For example, as shown in FIG. 38, the display surface 10-1 may include m*n display subregions 110, and the display surface 10-1 may include a*b sub-pixels, so one display subregion 110 includes (a/m)*(b/n) sub-pixels.

For example, the display subregion 110 where the gaze point position E1 is located is in the first row and the first column, and the coordinates of the gaze point position E1 are (X,Y), then the sub-pixel coordinate range in the first region 011 can be (0,0)~(a/m, b/n), 0<X<a/m and 0<Y<b/n, and the first region 011 can only include one display subregion 110.

For example, the display subregion 110 where the gaze point position E2 is located is in the fifth row and the seventh column. Assuming that the first region 011 is set to include nine display subregions 110, it will be expanded around the display subregion 110 where the gaze point position E2 is located.

For example, the display subregion 110 where the gaze point position E3 is located is in the last row and the first column. Assuming that the first region 011 is set to include 9 display subregions 110, it is expanded with the display subregion 110 where the gaze point position E3 is located as an edge.

The way of determining the first region according to the gaze point position shown in FIG. 38 is only exemplified, and the gaze point position can be located at the center of the first region or at the edge of the first region, which is not limited by the embodiment of the present disclosure. The embodiment of the present disclosure is not limited to the first region including one display subregion or nine display subregions, and the number of display subregions included in the first region can be determined according to actual needs, such as 2, 4, 6, 16, 25, and etc.

According to the embodiment of the present disclosure, by collecting the gaze point position of human eyes, the first region of the display subregion including the gaze point position of human eyes in the display device is displayed in high definition, and other display subregions are displayed in low definition, which is beneficial to reducing the transmission bandwidth.

For example, on the one hand, the content generation unit renders a display image of a multi-viewpoint image (view) based on the gaze position of human eyes; on the other hand, according to the spatial position of human eyes, the contents of multi-view images are rearranged, and the display contents satisfying the light field display rules are obtained. After rearranging the multi-view images as mentioned above, it can be adapted to the positional relationship between sub-pixels and light splitting structures (such as lenticular lenses) on the display surface to realize the display of three-dimensional (3D) images. For example, the content generating unit can be located on the PC side, such as a content generating module in the PC side.

Figure 39:
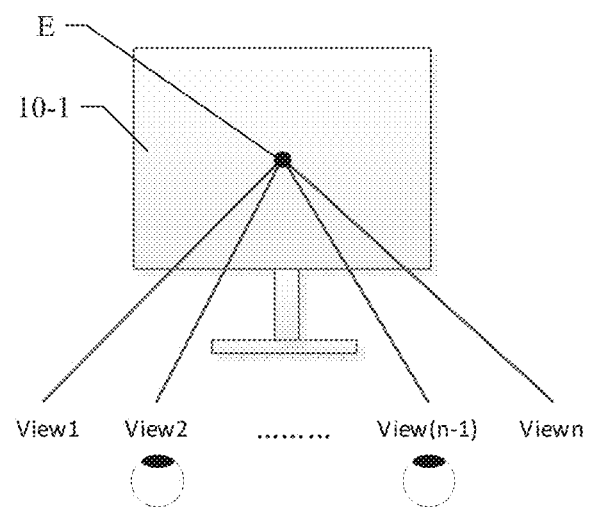
FIG. 39 is a schematic diagram of a display surface viewed by human eyes at different positions.

FIG. 39 is a schematic diagram of a display surface viewed by human eyes at different positions. For example, as shown in FIG. 39, in light field display, in order to satisfy the 3D effect of human eyes when viewing at different viewing angles, it is necessary to generate content according to the number of views set by the display device. In the light field display, the human eye can only see the images of several corresponding views at a fixed position, and the human eye at other view positions can only see the images at other corresponding angular positions.

Figure 40:
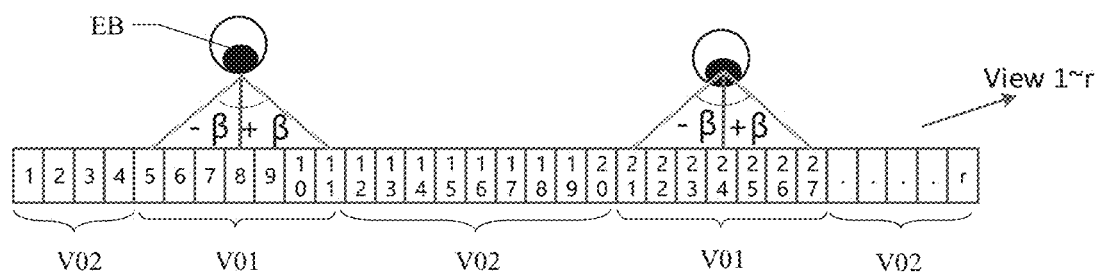
FIG. 40 is a schematic diagram of a plurality of first viewpoint images corresponding to eyeballs and a plurality of second viewpoint images except the first viewpoint images.

FIG. 40 is a schematic diagram of a plurality of first viewpoint images corresponding to eyeballs and a plurality of second viewpoint images except the first viewpoint images.

In some examples, as shown in FIG. 34, FIG. 35, FIG. 39 and FIG. 40, the content generating unit 30 is configured to collect images displayed on the display surface 10-1 at a plurality of different positions to generate a plurality of viewpoint images, which include a plurality of first viewpoint images V01 corresponding to the eyeball EB and a plurality of second viewpoint images V02 except the plurality of first viewpoint images V01, and at least one first viewpoint image V01 includes an image formed in the first region 011 and an image formed in the second region 012, each second viewpoint image V02 includes only images formed in the second region 012.

For example, the content generating unit 30 may include a virtual camera array, and the viewpoint image may be an image obtained by acquiring an image of a target object through the virtual camera array, and the collection viewing angle of different viewpoint images are different. For example, the collection viewing angle can be matched according to the possible viewing positions of users, so that one viewing position can match at least one viewpoint image, and different viewing positions can match viewpoint images of different viewing angles. For example, the user may be directly facing and watching the display surface of the display device, or watching the display surface of the display device from the side. For the face image, in the case where the user is directly facing the display surface of the display device, the viewpoint image matching the user's viewing position may be the front face of the face, in the case where the user moves to the left or right, the viewpoint image matching the user's viewing position can be the side of the face.

In some examples, as shown in FIG. 34, FIG. 35 and FIG. 40, the content generating unit 30 generating the adjustment data according to the gaze point position E includes: the content generating unit 30 being configured to adjust data of an image in which the first viewpoint image V01 is formed in the second region 012 and data of the second viewpoint image V02 to generate at least partial data of the adjustment data, and the at least partial data of the adjustment data being configured to reduce a display resolution of the image displayed in the second region 012.

For example, according to the gaze point characteristics of human eyes, because the resolution of fovea region of retina is the highest, the resolution of surrounding regions decreases gradually. When the eyeball rotates, the object that you want to see clearly will be imaged in the fovea region, while the surrounding objects will be imaged around the fovea region, resulting in that the human eye can only see the objects in the region where the gaze point is located, but not the objects around the gaze point. Usually, the angle between the range of high-definition region around the gaze point and the pupil of human eyes is 5°, and the resolution of the region centered on the gaze point and with an angle greater than 5° decreases rapidly.

For example, as shown in FIG. 40, considering the errors that may occur in the eye tracking process, all regions within the error range may be seen by human eyes during the eye tracking process, which may be the first viewpoint image V01 or the sensitive region view, and the viewpoint images at other positions may be the second viewpoint image V02 or the non-sensitive region view. The fovea characteristic of human eyes determines that human eye imaging is only clear in the fovea region. According to this feature of human eyes, the fovea region corresponding to the first viewpoint image V01 adopts high-definition original resolution upon rendering light field content, and the non-fovea region of human eyes adopts a resolution reduction method, so that the resolutions in the first direction and the second direction are reduced, for example, each is reduced to 1/w of the original resolution. According to this rule, the original data of the corresponding first viewpoint image V01 is rendered; for the non-sensitive regions of human eyes, the resolution of the second viewpoint image in the first direction and the second direction is reduced by reducing the resolution, for example, each is reduced to 1/w of the original resolution.

For example, it is also possible to realize that the first viewpoint image V01 has a high refresh rate relative to the second viewpoint image V02 through the control of the selection signal line group while the fovea region corresponding to the first viewpoint image V01 adopts high-definition original resolution.

For example, as shown in FIG. 40, the number of the first viewpoint images V01 and the second viewpoint images V02 is q, the major lobe angle is θ, the angle corresponding to each viewpoint image is θ/q, and the viewing angle corresponding to the visual sensitive region of the eyeball EB is ±β, then the number of the first viewpoint images V01 is 2*(β*q/θ). The major lobe angle as mentioned above can refer to the viewing angle where all viewpoint images are viewed.

In some examples, as shown in FIGS. 34 and 35, the adjustment data includes first content data and compressed data. The first content data includes data corresponding to an image configured to be transmitted to the first region, and the compressed data includes data generated by compressing second content data corresponding to an image configured to be transmitted to the second region by w times, where w is a positive integer greater than 1.

For example, the first content data and the second content data are original data corresponding to the first region and the second region, respectively. When transmitting data, the original data corresponding to the first region and the compressed data corresponding to the second region are transmitted, which is beneficial to reducing the bandwidth.

In some examples, as shown in FIGS. 34 and 35, the display data includes first display data and second display data, the data processing part 40 is configured to process the received first content data to process the first content data into the first display data corresponding to the image of the first region 011, and the data processing part 40 is further configured to repeatedly process the compressed data w times to form the second display data corresponding to the image of the second region.

For example, on the one hand, the data processing part 40 is used to decode the compressed image of the multi-view gaze point sent by the content generating unit 30, and restore it to a data format that can be directly received and displayed in combination with the gaze point position; on the other hand, it is used to drive the display panel to display. For example, the data processing part can be a time sequence controller (TCON).

For example, the PC terminal where the content generation unit is located transmits data to the data processing part through various standard interfaces, such as the high-definition multimedia interface (HDMI) and the display port (DP) interface, etc. The bandwidth of the interface determines the amount of data in a unit time, for example, the maximum transmission resolution of the interface is W*H, and based on this, the amount of data is calculated and transmitted. If the display panel needs multi-view images, the amount of the output data of the interface between the PC terminal where the content generation unit is located and the data processing part is less than the display requirements of the display panel, the display subregion scheme can be adopted, and the display subregion where the gaze point position is located in the display panel can be adjusted for high-definition display according to the gaze point position of human eyes, and other display subregions can be displayed for low-definition.

For example, among the above-mentioned viewpoint images, such as the first viewpoint image and the second viewpoint image, each first viewpoint image includes a high-definition image formed in the first region and a low-definition image formed in the second region. For example, the resolution of the first region may be W*H. For example, the image of the second region can be compressed by rw times in the horizontal direction and by rh times in the vertical direction, and the resolution of the second region can be (W/rw)*(H/rh). The above rw times and rh times only represent compression times, and can also be represented by w times.

Figure 41:
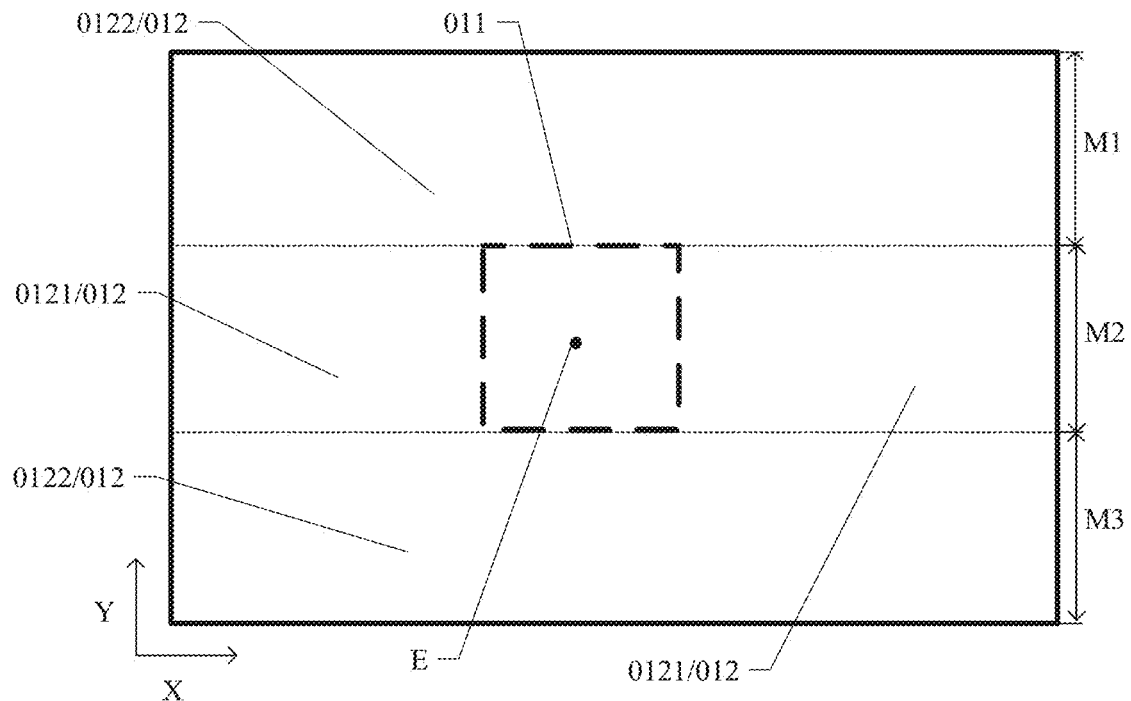
FIG. 41 is a schematic diagram of a positional relationship between a first region and a second region in the display panel.
Figure 42:
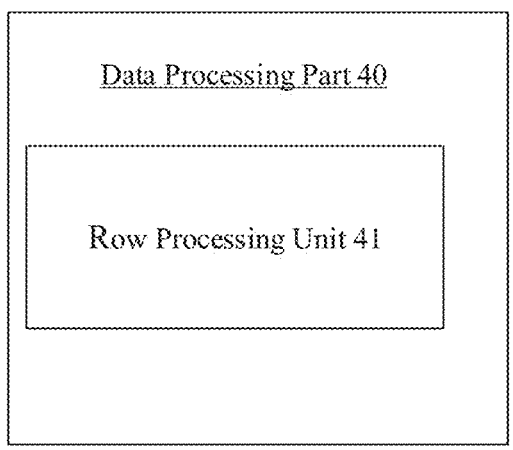
FIG. 42 is a structural block diagram of a data processing part.
Figure 43:
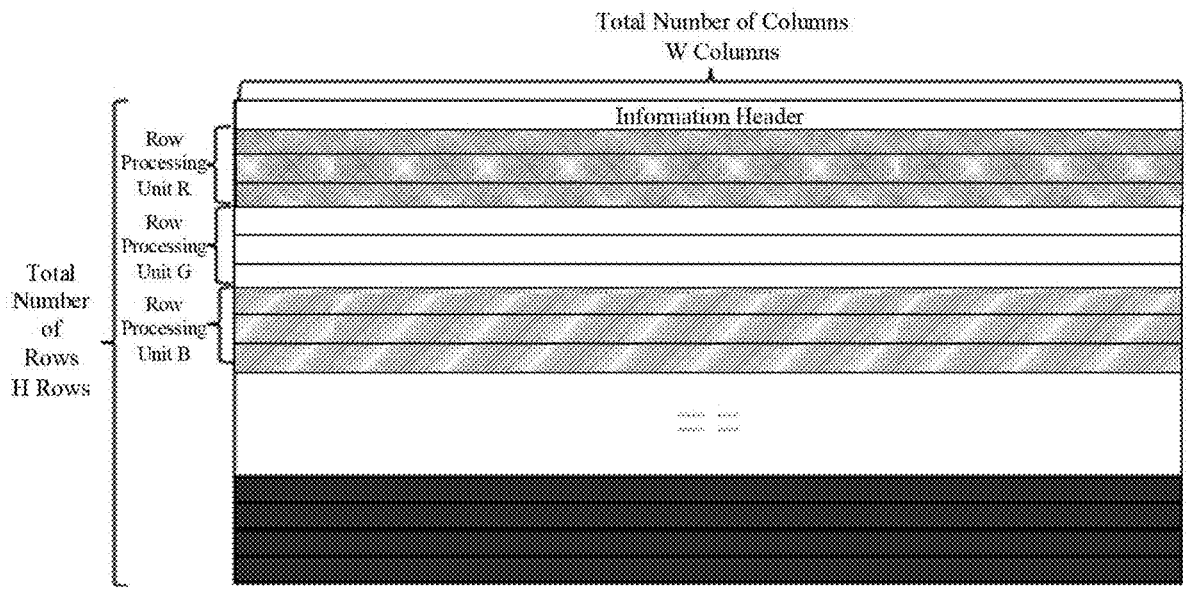
FIG. 43 is a corresponding relationship between a row processing unit and a sub-pixel row.
Figure 44:
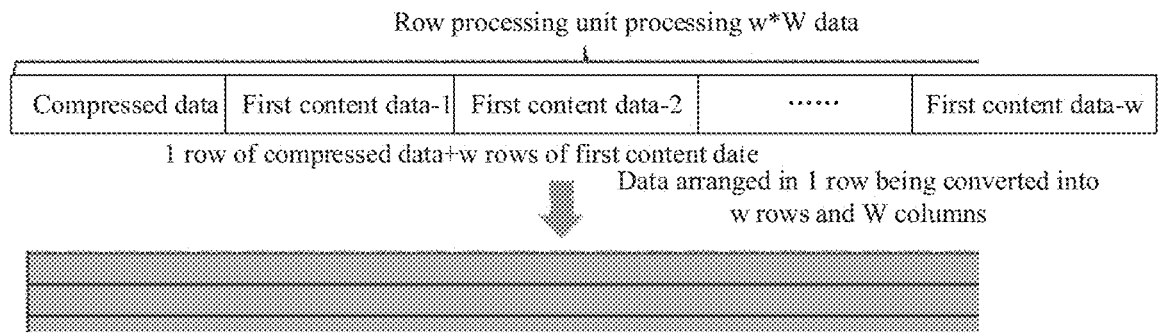
FIG. 44 is a process diagram of the row processing unit processing the data in the M2 region shown in FIG. 41.
Figure 45:
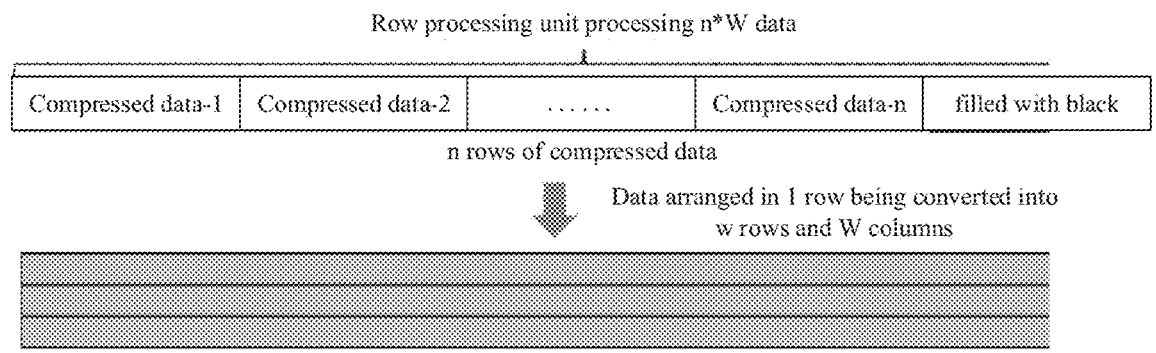
FIG. 45 is a process diagram of the row processing unit processing the data in the M1 region and the M3 region shown in FIG. 41.

FIG. 41 is a schematic diagram of a positional relationship between a first region and a second region in the display panel, FIG. 42 is a structural block diagram of the data processing part, FIG. 43 is a corresponding relationship between a row processing unit and a sub-pixel row, FIG. 44 is a process diagram of the row processing unit processing the data in the M2 region shown in FIG. 41, and FIG. 45 is a process diagram of the row processing unit processing the data in the M1 region and the M3 region shown in FIG. 41.

For example, the data processing part 40 may include a plurality of row processing units 41, and each row processing unit 41 may process image data of one row of sub-pixels.

In some examples, as shown in FIGS. 34 and FIGS. 41 to 44, the second region 012 includes a first sub-region 0121 located on at least a side of the first region 011 in the row direction, which may refer to the X direction in the figure. Adjustment data includes p*w rows of adjustment data; the p*w rows of adjustment data transmitted to the row processing unit 41 by the content generating unit 30 includes p row compressed data and q*w rows of first content data, the image corresponding to the q*w rows of first content data is located in the first region 011, and the image corresponding to the q row compressed data in the p row compressed data is located in the first sub-region 0121; the row processing unit 41 is configured to repeatedly process the q row compressed data processing for w times to form q*w rows of second display data, and process the q*w rows of first content data into q*w rows of first display data, where 1≤q≤p, and both p and q are positive integers.

For example, as shown in FIG. 34, FIG. 41 to FIG. 44, in the case where the content generating unit 30 transmits data of M2 region to the row processing unit 41, this part of data includes compressed data corresponding to the first sub-region 0121 and uncompressed data corresponding to the first region 011. For example, in the case where the data in the M2 region transmitted from the content generating unit 30 to the row processing unit 41 includes both the one row of data which has been compressed corresponds to the first sub-region 0121 and the w-rows of first content data corresponding to the first region 011, the row processing unit 41 repeatedly processes the one row of compressed data which is compressed for w times to generate w row second display data, and the row processing unit 41 processes w rows of first content data to generate w rows of first display data, and finally forms w rows of data. The example shown in FIG. 44 takes w columns data as an example. For example, one row of data used for low-definition display can correspond to w rows of data used for high-definition display. During the processing of the row processing unit, the data used for low-definition display can be filled into the row processing unit first, and then the data used for high-definition display can be merged and filled into the row processing unit for transmission.

For example, as shown in FIG. 43, the row processing unit R can be used to process the data of three rows of red sub-pixels, the row processing unit G can be used to process the data of three rows of green sub-pixels, and the row processing unit B can process the data of three rows of blue sub-pixels, which are repeated sequentially. For example, the number of rows of sub-pixels is H rows and the number of columns of sub-pixels is W columns.

In some examples, as shown in FIG. 34, FIG. 41 to FIG. 45, the second region 012 further includes a second sub-region 0122 located on at least one side of the first region 011 in the column direction, and the column direction is the Y direction shown in the figure. Images corresponding to (p-q) rows of compressed data other than q rows of compressed data are located in the second sub-region 0122, and the row processing unit 41 is configured to repeatedly process the (p-q) rows of compressed data for w times to form (p-q)*w rows of second display data.

For example, as shown in FIG. 34, FIG. 41 to FIG. 45, when the content generating unit 30 transmits the data of M1 region and M3 region to the row processing unit 41, this part of data only includes the compressed data corresponding to the second region 012, so as to reduce the bandwidth. For example, when the content generation unit 30 transmits the compressed one row data corresponding to the second sub-region 0122 in the M1 region or M3 region to the row processing unit 41, the row processing unit 41 repeatedly processes one row compressed data, which is compressed, w times to generate w rows of second display data. If the data filled in the row processing unit cannot be filled, the extra position can be filled with black (or zero).

For example, when the content generation unit 30 transmits data in the M1 region, M2 region and M3 region to the row processing unit 41, the data in the corresponding M2 region after processing by the data processing part can fill the data in the row processing unit. At this time, the data in the M1 region and M3 region after processing by the data processing part may or may not fill the data in the row processing unit, depending on the number of the first display data corresponding to the first region and the times when the compressed data corresponding to the second region is compressed.

For example, as shown in FIG. 45, when the content generation unit transmits data in M1 and M3 regions to the row processing unit, it can transmit n rows of compressed data to the row processing unit, and each row of compressed data is processed into w rows of second display data. The example shown in FIG. 45 takes W column data as an example.

For example, as shown in FIG. 43, before the row processing unit 41 processes the data in the M1 region to M3 region, the content generation unit transmits the first row of information header data to the data processing part, and the information header data includes the maximum resolution of the interface, the number of view images, the resolution of the view images, the horizontal compression ratio of the second region images, the vertical compression ratio of the second region images, the resolution of the second region, the resolution of the first region, and the position of the display subregion on the display surface, the size of the display subregion on the display surface, the number of rows of processing units, the coordinates of a position between the eyebrows of human eyes and other data are filled with zeros to form one row of W-long data, and is then transmitted to the data processing part.

Figure 46:
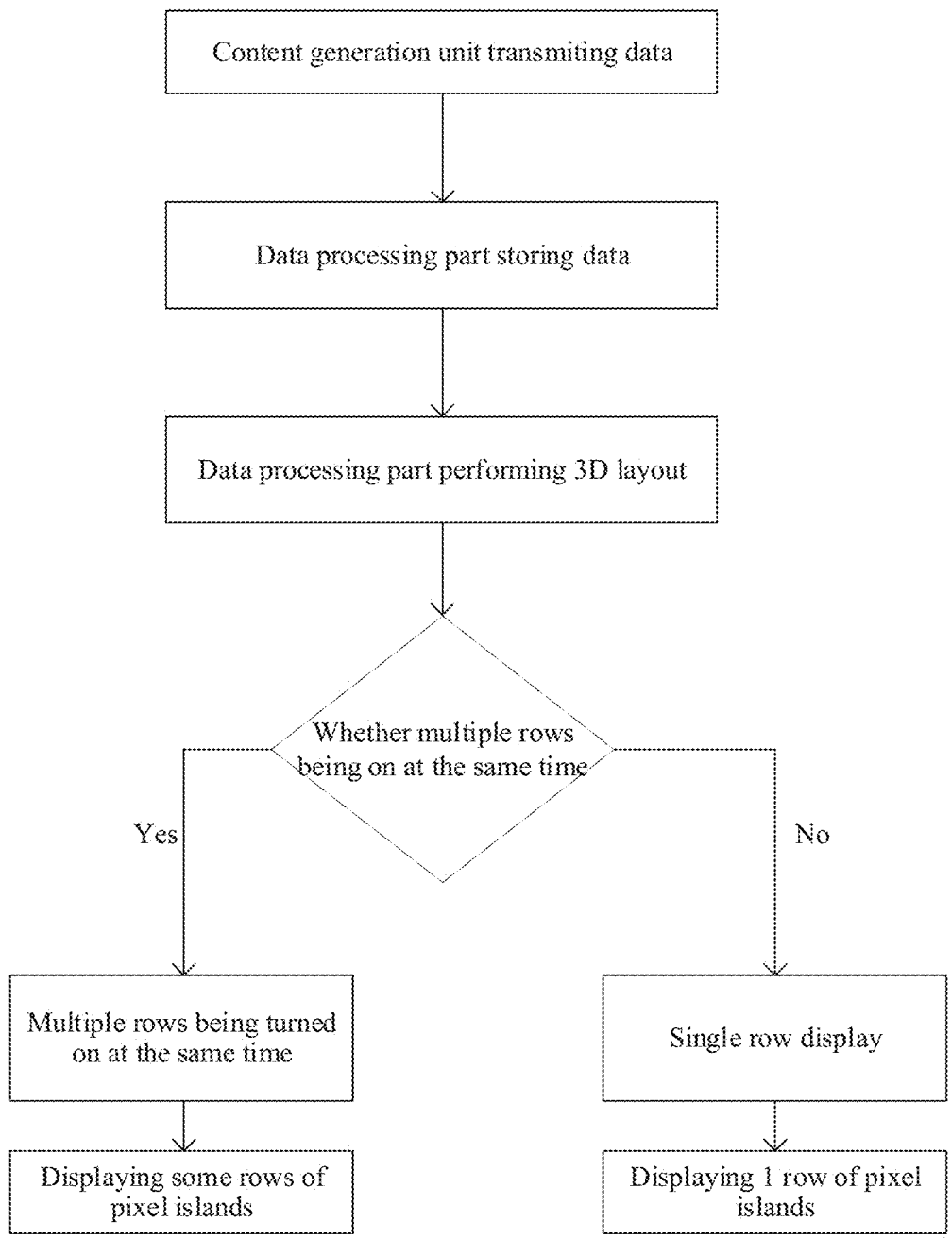
FIG. 46 is a data processing flow chart of the data processing part.

FIG. 46 is a structural block diagram of a data processing part. For example, as shown in FIG. 46, the processing flow of the data processing part may include storing the data transmitted by the content generation unit in the data processing part, and the data processing part performs 3D layout once or more, such as PC row processing unit transmitting data to TCON, TCON storing row processing unit data, and TCON performing 3D sub-pixel layout once or more.

For example, it is judged whether multiple rows are on at the same time, and if so, the multiple rows are controlled to be on at the same time, and the multiple rows are displayed with pixel islands; if not, single row display control is performed, and one row pixel island is displayed. For example, when multiple rows are turned on at the same time, TCON needs to send a control signal for multiple rows being on while sending row data to the integrated circuit (IC) of the display panel. The multiple rows being turned on at the same time can be applied to the display of the second region to realize the display of low-definition pictures, and the single row display can be applied to the display of the first region to realize the display of high-definition pictures.

For example, the sub-pixels included in each pixel island in the display surface perform the calculation of the View where the sub-pixels are located and the assignment of the color gray level, that is, the sub-pixel layout. For example, the sub-pixel layout method can include a layout method based on angular spectrum measurement and a layout method based on the period of a light splitting structure (such as a lens).

For example, the data processing part can send the processed data to the driving circuit of the display panel according to the data display requirements of the display panel, and the driving circuit controls the display.

Figure 47:
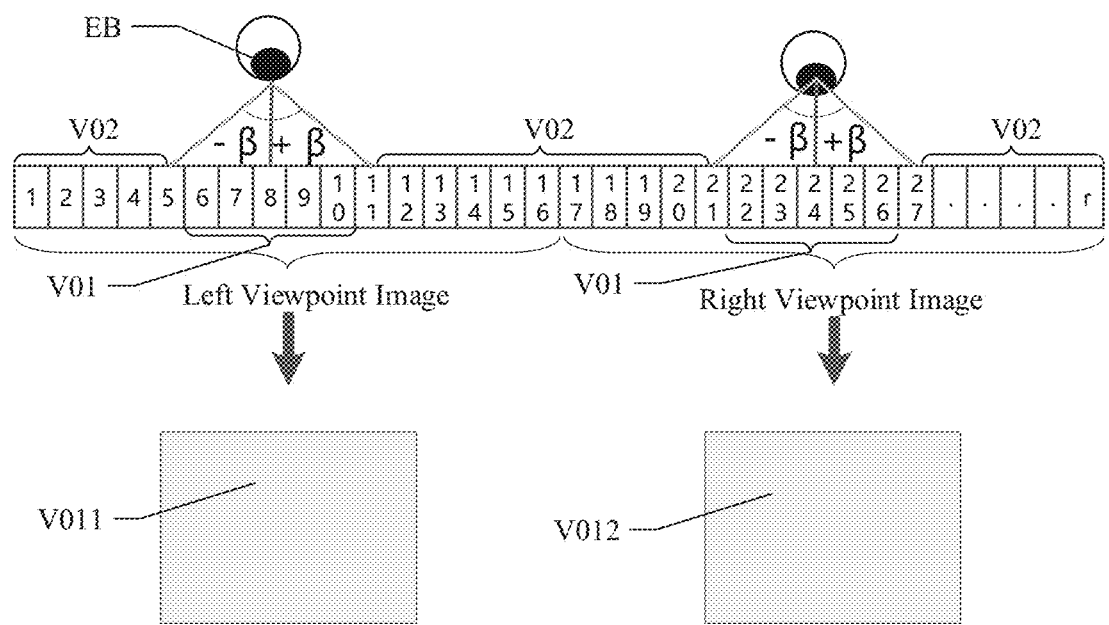
FIG. 47 is a schematic diagram of a plurality of first viewpoint images corresponding to eyeballs and a plurality of second viewpoint images except the first viewpoint images provided according to another example of the embodiment of the present disclosure.

The content generation unit in the examples shown in FIGS. 40 to 46 processes data in a multi-view rendering mode. FIG. 47 is a schematic diagram of a plurality of first viewpoint images corresponding to eyeballs and a plurality of second viewpoint images except the first viewpoint images provided according to another example of the embodiment of the present disclosure.

For example, as shown in FIG. 47, this example adopts the way of rendering only the left viewpoint image and right viewpoint image, and copies and expands the sub-pixel contents of the left viewpoint image and right viewpoint image to all viewpoint images, which is beneficial to realizing that the left eye can see the view of the left eye and the right eye can see the view of the right eye when the human eye watches, and the three-dimensional scene content can be seen through the binocular parallax principle. In addition, the pressure and delay of rendering and transmission can be further reduced by only rendering the left viewpoint image and the right viewpoint image.

For example, both the left viewpoint image and the right viewpoint image include at least one first viewpoint image V01 corresponding to the eyeball EB and a plurality of second viewpoint images V02 except the at least one first viewpoint image V01. The first viewpoint image V01 includes an image formed in the first region 011 and an image formed in the second region 012. For example, only one first viewpoint image V01 corresponding to the left eye in the eyeball EB can be copied to form a left viewpoint image, and only one first viewpoint image V01 corresponding to the right eye in the eyeball EB can be copied to form a right viewpoint image. For example, if the number of viewpoint images is r, the viewpoint V01 corresponding to the left eye repeats r/2 times to form the left eye viewpoint image V011, and the viewpoint image V01 corresponding to the right eye repeats r/2 times to form the right eye viewpoint image V012.

In this example, the display method for forming the display surface including the first region and the second region may be the same as that shown in FIGS. 40 to 46, and will not be repeated here.

For example, for a 3D scheme that needs to display the light field of the left and right images, the left viewpoint image and the right viewpoint image can be decomposed into red, green and blue three-channel images according to the driving requirements of the display panel, and the resolutions of the red, green and blue three-channel images corresponding to the left viewpoint image and the resolutions of the red, green and blue three-channel images corresponding to the right viewpoint are the same, such as w0*h.

For example, at least one of the data processing part and the content generating unit can mean that the control function is realized by hardware, that is, a person skilled in the art can build a corresponding hardware circuit to realize the control function regardless of the cost. For example, the hardware circuit includes conventional VLSI circuits or gate arrays and existing semiconductors such as logic chips and transistors, or other discrete components. For example, the controller can also be implemented with programmable hardware devices, such as field programmable gate arrays, programmable array logic, programmable logic devices, etc., which is not limited by this embodiment.

For example, at least one of the data processing part and the content generating unit may also mean that the control function is realized by a software algorithm so as to be executed by various types of processors. For example, considering the level of the existing hardware technology, the controller can be a module realized by a software algorithm.

In the display device provided by the embodiment of the present disclosure, after the eye tracker tracks the gaze point position on the display surface of the display panel corresponding to the human eye, the first content data corresponding to the high-definition image in the first region where the gaze point position is located and the compressed data corresponding to the low-definition image in the second region where the non-gaze point position is located are generated by the content generation data, and the first content data and the compressed data are processed by the data processing part and transmitted to the driving circuit of the display panel to drive the display subregion including sub-pixels for display, so that the hardware requirements for content rendering, transmission, and display are greatly reduced while meeting the viewing requirements of the human eye.

The following statements should be noted: (1) in the accompanying drawings of the embodiments of the present disclosure, the drawings involve only the structure(s) in connection with the embodiment(s) of the present disclosure, and other structure(s) can be referred to common design(s); (2) in case of no conflict, features in one embodiment or in different embodiments can be combined.

What have been described above are only exemplified embodiments of the present disclosure, the protection scope of the present disclosure is not limited thereto, and the protection scope of the present disclosure should be defined by the claims.

The invention claimed is:

1. A display panel, comprising:
   a base substrate;
   a plurality of sub-pixels, located on the base substrate, at least a part of the sub-pixels comprising a pixel circuit;
   a plurality of data lines, located on the base substrate and arranged along a first direction, and the pixel circuit of at least one sub-pixel being electrically connected with one of the data lines;
   a plurality of gate lines, located on the base substrate and arranged along a second direction, the pixel circuit of the at least one sub-pixel being electrically connected with one of the gate lines, and the first direction intersects with the second direction,
   wherein the display panel comprises a plurality of display subregions and a plurality of selection signal line groups, the plurality of display subregions are arranged in one-to-one correspondence with the plurality of selection signal line groups, each display subregion comprises at least two sub-pixels, each selection signal line group comprises a plurality of selection signal lines, and the selection signal lines corresponding to different display subregions are insulated from each other;
   the pixel circuit comprises a transistor, an active semiconductor layer in the transistor of the at least one sub-pixel comprises a first part and a second part, the first part overlaps with the gate line electrically connected with the transistor, and the second part overlaps with at least one selection signal line in a direction perpendicular to the base substrate, and the gate line and the selection signal line are both configured to turn on the transistor upon being input with a turn-on voltage.

2. The display panel according to claim 1, wherein the plurality of display subregions comprise M display subregions arranged along the first direction, and at least one gate line passes through the M display subregions arranged along the first direction, and M is a positive integer greater than or equal to 2,
   in each of at least some of the selection signal line groups, all of the selection signal lines are electrically connected.

3. The display panel according to claim 1, wherein the plurality of selection signal lines in at least one selection signal line group comprise a plurality of first selection signal lines, and the first selection signal lines overlap with the second part.

4. The display panel according to claim 3, wherein the first selection signal lines and the gate lines are located on a same layer, or the first selection signal lines and the gate lines are located in different layers.

5. The display panel according to claim 4, wherein an extension direction of the first selection signal lines is the same as an extension direction of the gate lines, and two adjacent display subregions arranged along the first direction comprise a first display subregion and a second display subregion, and one of the plurality of first selection signal lines arranged in the first display subregion and one of the plurality of first selection signal lines arranged in the second display subregion are located in a same straight line and arranged at intervals.

6. The display panel according to claim 4, wherein the plurality of selection signal lines in the at least one selection signal line group further comprise at least one second selection signal line, and the second selection signal line is located in a different layer from the first selection signal lines and is electrically connected with the first selection signal lines,
   an extension direction of the first selection signal lines is the same as an extension direction of the gate lines, an extension direction of the second selection signal line intersects with the extension direction of the first selection signal lines, and at least one second selection signal line passes through the plurality of display subregions.

7. The display panel according to claim 6, wherein each of at least some of the data lines is electrically connected with two sub-pixels arranged in the first direction;
the plurality of gate lines comprise first gate lines and second gate lines alternately arranged along the second direction, a gate line pair including a first gate line and a second gate line is disposed between two adjacent sub-pixels arranged along the second direction, and one of the two sub-pixels arranged along the first direction and electrically connected with the same data line is electrically connected with the first gate line and the other is electrically connected with the second gate line;
the second selection signal line and the data lines are located on the same layer;
the extension direction of the second selection signal line is the same as that of the data lines, the second selection signal line is located between two adjacent sub-pixels arranged along the first direction, and the two adjacent sub-pixels are electrically connected with different data lines, respectively.

8. The display panel according to claim 7, wherein one first selection signal line is arranged between the gate lines in each gate line pair, and second parts of the transistors of the pixel circuits electrically connected with the first gate line and the second gate line in the same gate line pair overlaps with a same first selection signal line located between the gate lines in the same gate line pair.

9. The display panel according to claim 7, wherein the plurality of first selection signal lines comprise a plurality of first selection signal line pairs, and a first selection signal line pair is arranged between two adjacent sub-pixels arranged in the second direction;
one gate line pair is arranged between the first selection signal lines in each first selection signal line pair, or one first selection signal line pair is arranged between the gate lines in each gate line pair.

10. The display panel according to claim 6, wherein the second selection signal line and the data lines are located in different layers;
the display panel further comprises:
a shading layer, located between the data lines and the base substrate,
wherein the second selection signal line and the shading layer are arranged in a same layer,
an extension direction of the second selection signal line is the same as that of at least a part of the data lines, and the second selection signal line overlaps the data lines in a direction perpendicular to the base substrate.

11. The display panel according to claim 4, wherein the first selection signal lines comprise at least one first sub-selection signal line and a plurality of second sub-selection signal lines electrically connected with each other, and the second sub-selection signal lines overlap with the second part;
an extension direction of the second sub-selection signal lines intersects with the extension direction of the gate line, an extension direction of the first sub-selection signal line intersects with the extension direction of the second sub-selection signal lines, and the second sub-selection signal lines corresponding to each display subregion are insulated from the second sub-selection signal lines corresponding to other display subregions.

12. The display panel according to claim 11, wherein the plurality of selection signal lines in the at least one selection signal line group further comprise at least one second selection signal line, which is located in different layers from the first selection signal line and is electrically connected with the first selection signal line, and the second selection signal line passes through at least one display subregion;
each of at least some of the data lines is electrically connected with two sub-pixels arranged in the first direction;
the plurality of gate lines comprise first gate lines and second gate lines alternately arranged along the second direction, a gate line pair including a first gate line and a second gate line is arranged between two adjacent sub-pixels arranged along the second direction, and one of the two sub-pixels arranged along the first direction and electrically connected with the same data line is electrically connected with the first gate line and the other is electrically connected with the second gate line;
the second selection signal line and the data lines are located on a same layer;
the extension direction of the second selection signal line is the same as that of at least a part of the data lines, the second selection signal line is located between two adjacent sub-pixels arranged along the first direction and electrically connected with different data lines respectively.

13. The display panel according to claim 11, wherein the second selection signal line and the data lines are located in different layers;
in a direction perpendicular to the base substrate, the second sub-selection signal lines and the second selection signal line overlap the data line, or the second sub-selection signal lines overlap data line, or the second selection signal line overlap the data line;
the first sub-selection signal line and the second sub-selection signal lines are an integral structure.

14. The display panel according to claim 1, further comprising:
a plurality of gate driver groups, arranged along the second direction, the gate driver groups being electrically connected with the gate lines, and at least part of the gate driver groups being configured to be individually input with a frame start signal,
a plurality of frame start signal lines,
wherein the plurality of display subregions comprise a plurality of display subregion rows arranged along the second direction, each display subregion row comprises display subregions arranged along the first direction, and the plurality of gate driver groups are electrically connected with the plurality of display subregion rows in one-to-one correspondence,
the plurality of frame start signal lines are electrically connected with the plurality of gate driver groups in one-to-one correspondence.

15. The display panel according to claim 14, further comprising:
at least one frame start signal line,
wherein a plurality of control units are arranged between the plurality of gate driver groups and the at least one frame start signal line, and the plurality of control units are electrically connected with the plurality of gate driver groups in one-to-one correspondence;
each frame start signal line is electrically connected with at least two control units of the plurality of control units to input frame start signals to the at least two control units of the plurality of control units, the at least one frame start signal line only comprises one frame start signal line, and the one frame start signal line is electrically connected with the plurality of control units to input a frame start signal to each of the plurality of control units individually.

16. The display panel according to claim 1, wherein at least one gate line comprises two sub-gate lines and at least one connection part connecting the two sub-gate lines, the two sub-gate lines are arranged in parallel at a same layer, and the two sub-gate lines and the connection part are in different layers, and the two sub-gate lines included in each gate line are electrically connected through the connection part;

one of the two sub-gate lines overlaps with the first portion.

17. A display device comprising:
an eye tracker;
a content generating unit, electrically connected with the eye tracker;
a data processing part, electrically connected with the content generating unit; and
the display panel according to claim 1, electrically connected with the data processing part,
wherein the eye tracker is configured to determine a gaze point position, on a display surface of the display panel, corresponding to an eyeball by tracking a position of the eyeball, and the gaze point position is located in a first region of the display surface, and the display surface further comprises a second region outside the first region, and the first region comprises at least one display subregion;
the content generating unit is configured to generate adjustment data according to the gaze point position;
the data processing part is configured to generate display data according to the adjustment data;
the display panel is configured to receive the display data to adjust a display resolution of an image displayed in the first region to be greater than that of an image displayed in the second region.

18. The display device according to claim 17, wherein the first region comprises one display subregion, and the gaze point position is located in the one display subregion; or, the gaze point position is located in one display subregion, and the first region comprises other display subregions surrounding the one display subregion.

19. The display device according to claim 17, wherein the content generating unit is configured to collect images displayed on the display surface at a plurality of different positions to generate a plurality of viewpoint images, the plurality of viewpoint images comprise a plurality of first viewpoint images corresponding to the eyeball and a plurality of second viewpoint images except the plurality of first viewpoint images, and at least one first viewpoint image comprises an image formed in the first region and an image formed in the second region, and each second viewpoint image only comprises an image formed in the second region, wherein the content generating unit generating the adjustment data according to the gaze point position comprises:

the content generating unit being configured to adjust data of an image in which the first viewpoint image is formed in the second region and data of the second viewpoint image to generate at least partial data of the adjustment data, and the at least partial data of the adjustment data is configured to reduce a display resolution of the image displayed in the second region;

the adjustment data comprises first content data and compressed data, the first content data comprises data corresponding to an image configured to be transmitted to the first region, and the compressed data comprises data generated by compressing second content data corresponding to an image configured to be transmitted to the second region by w times, where w is a positive integer greater than 1;

the display data comprises first display data and second display data, the data processing part is configured to process the received first content data into the first display data corresponding to the image of the first region, and the data processing part is further configured to repeatedly process the compressed data w times to form the second display data corresponding to the image of the second region.

20. The display device according to claim 19, wherein the second region comprises a first sub-region located on at least one side of the first region in the row direction, and the adjustment data comprises p*w rows of adjustment data;

the data processing part comprises a row processing unit, the p*w rows of adjustment data transmitted to the row processing unit by the content generating unit comprises p row compressed data and q*w rows of first content data, the image corresponding to the q*w rows of first content data is located in the first region, and the image corresponding to the q row compressed data in the p row compressed data is located in the first sub-region;

the row processing unit is configured to repeatedly process the q row compressed data processing for w times to form q*w rows of second display data, and process the q*w rows of first content data into q*w rows of first display data, where 1≤q≤p, and both p and q are positive integers;

the second region further comprises a second sub-region located on at least one side of the first region in the column direction;

an image corresponding to (p-q) rows of compressed data other than the q rows of compressed data among the p rows of compressed data are located in the second sub-region, and the row processing unit is configured to repeatedly process the (p-q) rows of compressed data for w times to form (p-q)*w rows of second display data.

* * * * *

UNITED STATES PATENT AND TRADEMARK OFFICE
CERTIFICATE OF CORRECTION

PATENT NO. : 12,424,128 B2
APPLICATION NO. : 18/724792
DATED : September 23, 2025
INVENTOR(S) : Jiankang Sun et al.

Page 1 of 1

It is certified that error appears in the above-identified patent and that said Letters Patent is hereby corrected as shown below:

On the Title Page

Inventors item (72) Line 1, delete "Fugiang" and insert --Fuqiang--.

Signed and Sealed this
Ninth Day of December, 2025

John A. Squires
*Director of the United States Patent and Trademark Office*